United States Patent
Hashimoto

(10) Patent No.: US 9,525,268 B2
(45) Date of Patent: Dec. 20, 2016

(54) QUANTUM CASCADE LASER

(71) Applicant: SUMITOMO ELECTRIC INDUSTRIES, LTD, Osaka (JP)

(72) Inventor: Jun-ichi Hashimoto, Chigasaki-shi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/865,296

(22) Filed: Sep. 25, 2015

(65) Prior Publication Data
US 2016/0094015 A1 Mar. 31, 2016

(30) Foreign Application Priority Data
Sep. 26, 2014 (JP) ................. 2014-197253

(51) Int. Cl.
H01S 5/34 (2006.01)
H01S 5/125 (2006.01)
H01S 5/22 (2006.01)
H01S 5/02 (2006.01)
H01S 5/022 (2006.01)
H01S 5/024 (2006.01)

(52) U.S. Cl.
CPC ............ *H01S 5/3402* (2013.01); *H01S 5/125* (2013.01); *H01S 5/0202* (2013.01); *H01S 5/0224* (2013.01); *H01S 5/02272* (2013.01); *H01S 5/02476* (2013.01); *H01S 5/22* (2013.01); *H01S 5/2224* (2013.01); *H01S 2301/176* (2013.01)

(58) Field of Classification Search
CPC .................. H01S 5/3402; H01S 5/22
See application file for complete search history.

(56) References Cited

U.S. PATENT DOCUMENTS 9,300,115 B2 * 3/2016 Tsuji ................. H01S 5/3402
2003/0231686 A1 * 12/2003 Liu ................. B82Y 20/00
372/50.11

OTHER PUBLICATIONS

M. M. Raj et al., "Highly Uniform 1.5 μm Wavelength Deeply Etched Semiconductor/Benzocyclobutene Distributed Bragg Reflector Lasers". Jpn. J. Appl. Phys., vol. 39, pp. L 1297-L 1299 (2000).

(Continued)

Primary Examiner — Dung Nguyen
(74) Attorney, Agent, or Firm — Smith, Gambrell & Russell, LLP

(57) ABSTRACT

A quantum cascade laser includes a substrate having a principal surface including first and second regions arranged along a first axis; a laser structure disposed on the principal surface in the second region, the laser structure having an end facet intersecting the first axis, the laser structure including a stripe-shaped stacked semiconductor layer extending along the first axis; and a distributed Bragg reflection structure disposed on the principal surface in the first region, the distributed Bragg reflection structure including a semiconductor wall made of a single semiconductor material, the distributed Bragg reflection structure being optically coupled to the end facet of the laser structure. The semiconductor wall has first and second side surfaces that intersect the first axis and extend along a second axis intersecting the principal surface. The semiconductor wall is located away from the end facet of the laser structure.

17 Claims, 19 Drawing Sheets

(56) References Cited

OTHER PUBLICATIONS

M. M. Raj et al., Highly Uniform 1.5 μm Wavelength Deeply Etched Semiconductor/Benzocylobutene Distributed Bragg Reflector Lasers, Jpn. J. Appl. Phys., vol. 39, pp. L 1297-L 1299 (2000).

S. Golka et al., "GaAs/AlGaAs quantum cascade lasers with dry etched semiconductor-air Bragg reflectors", Journal of Modern Optics, vol. 52, No. 16, pp. 2303-2308, (2005).

M. Ariga et al., "Low Threshold GaInAsP Lasers with Semiconductor/Air Distributed Bragg Reflector Fabricated by Inductively Coupled Plasma Etching", Jpn. J. Appl. Phys., vol. 39, pp. 3406-3409, (2000).

\* cited by examiner

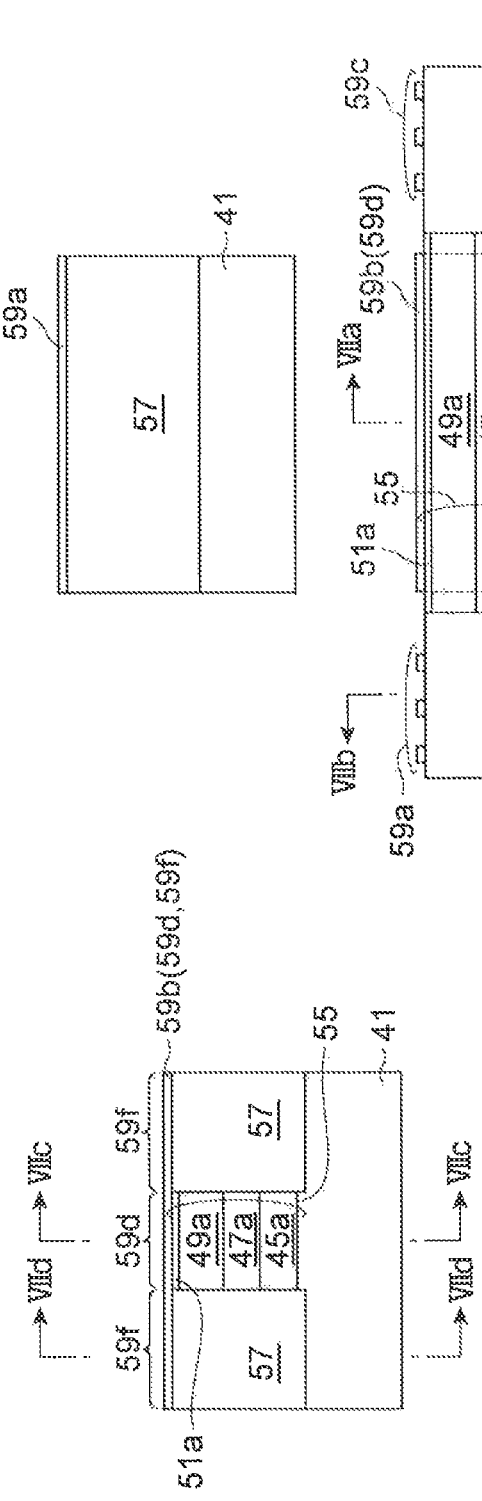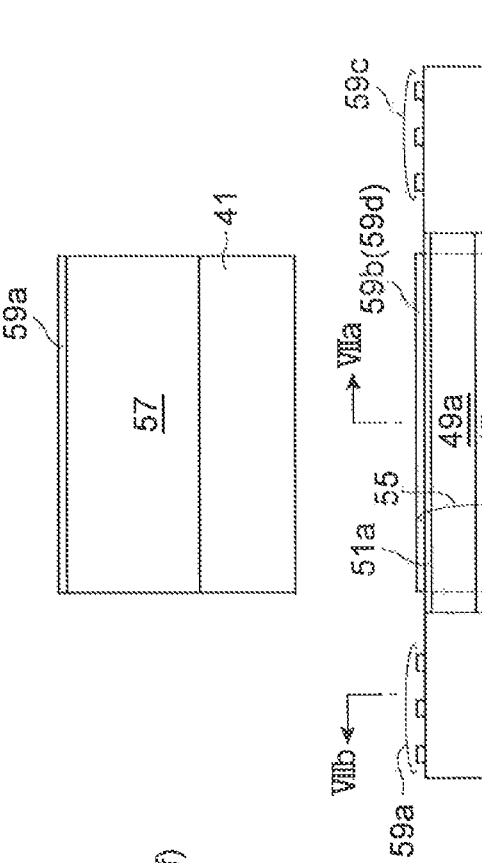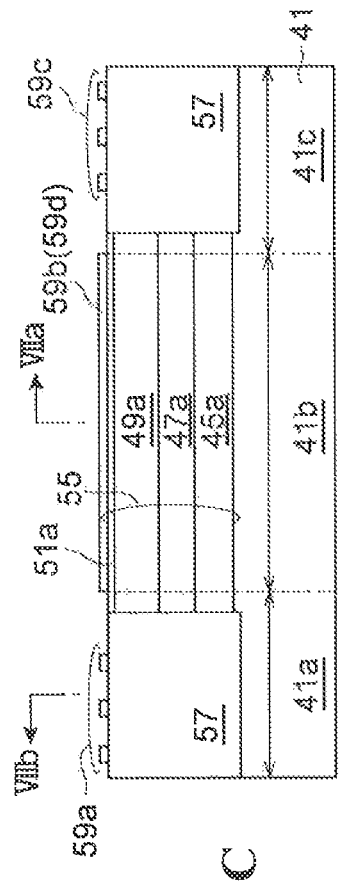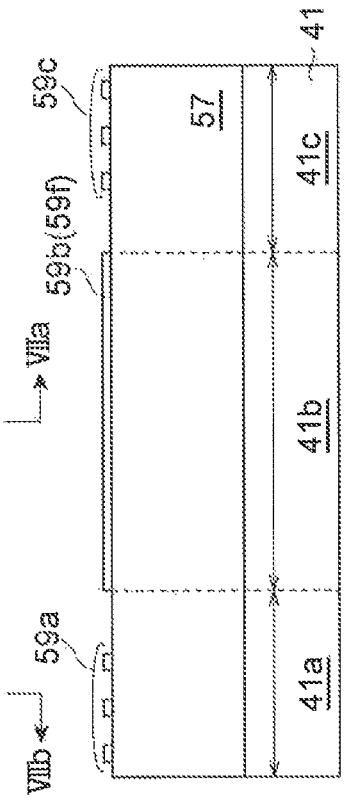

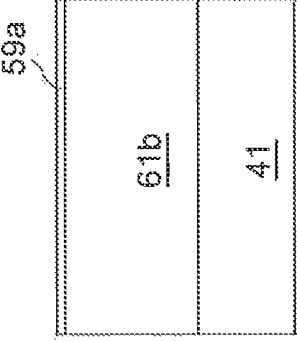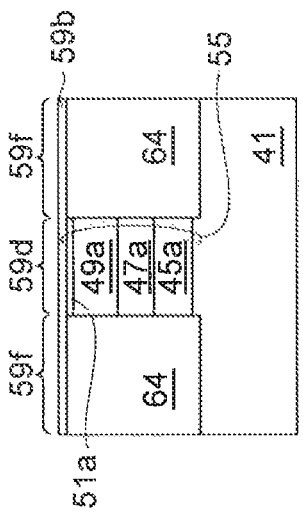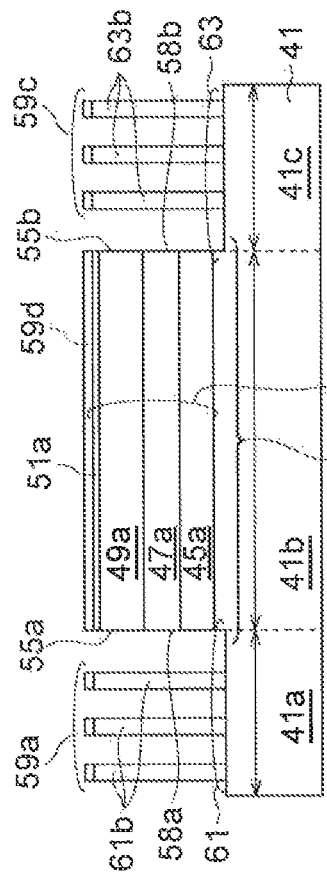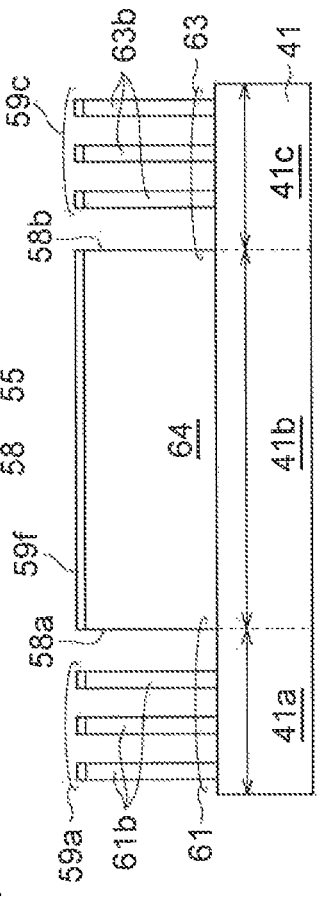

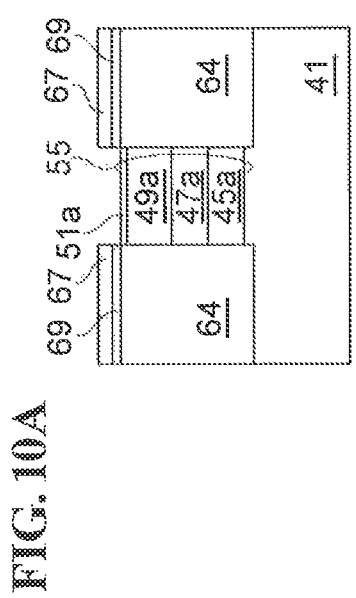
FIG. 10A
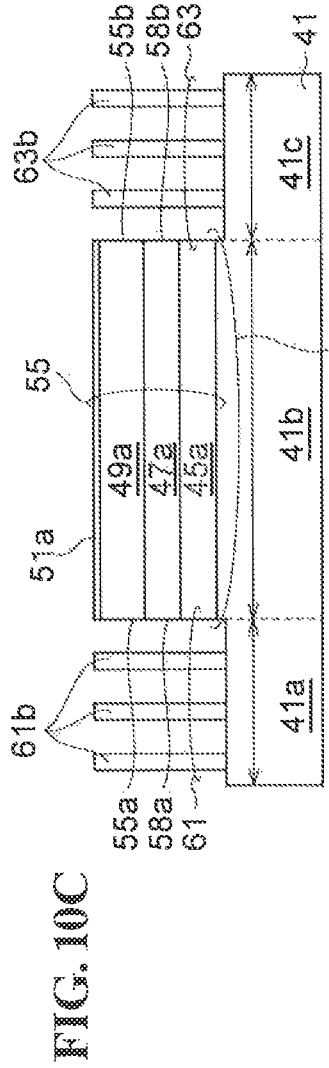
FIG. 10B
FIG. 10C
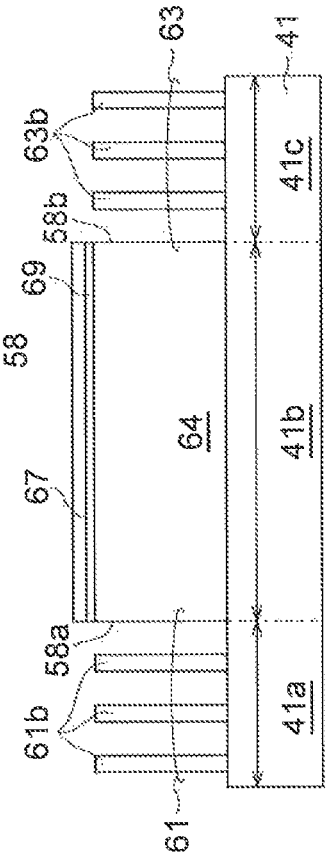
FIG. 10D

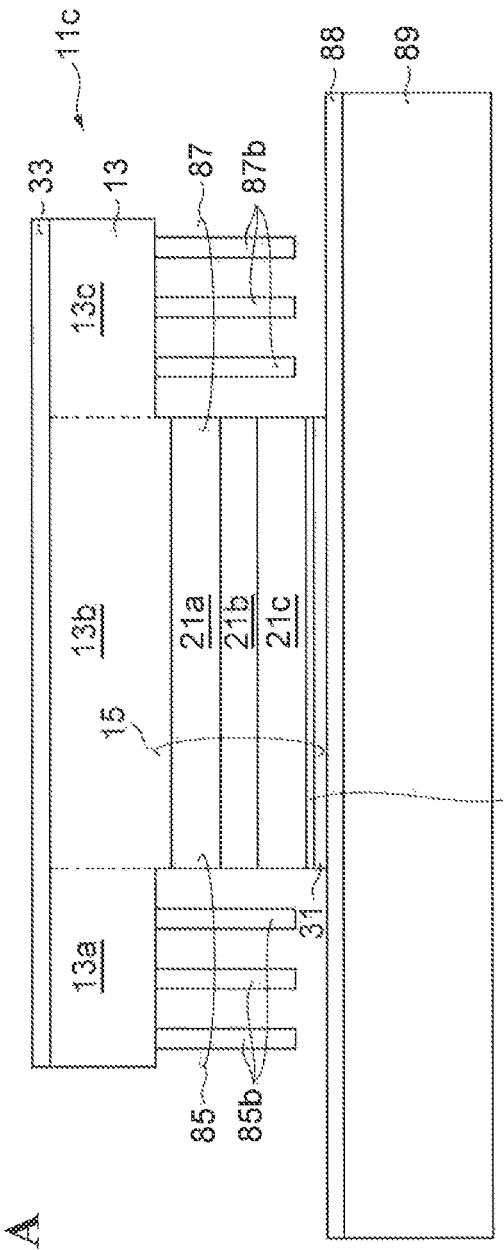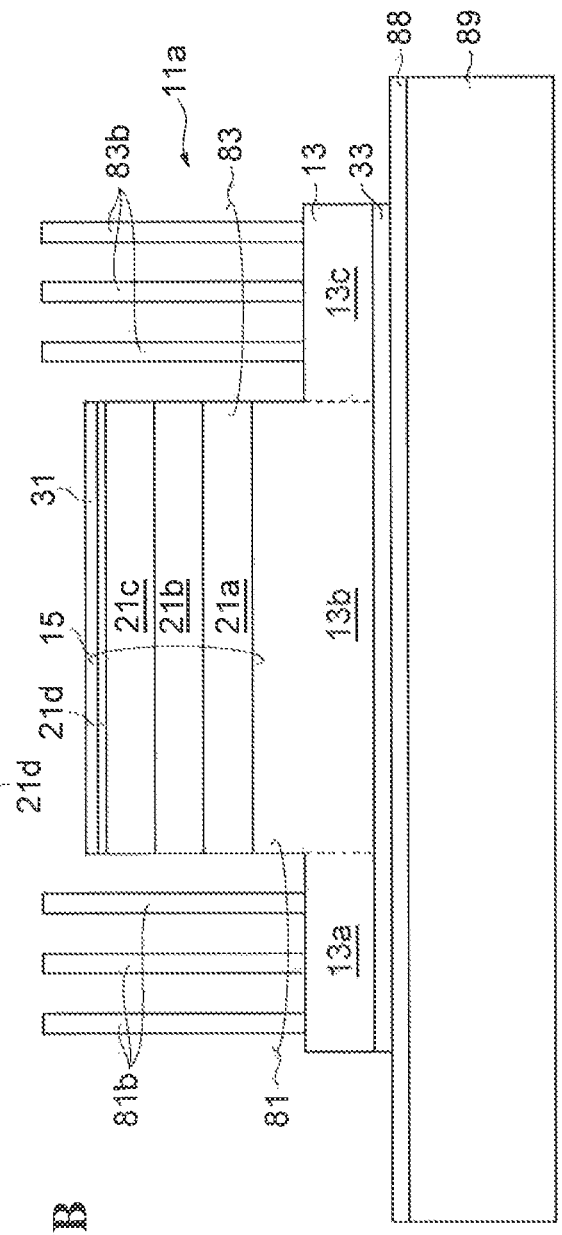

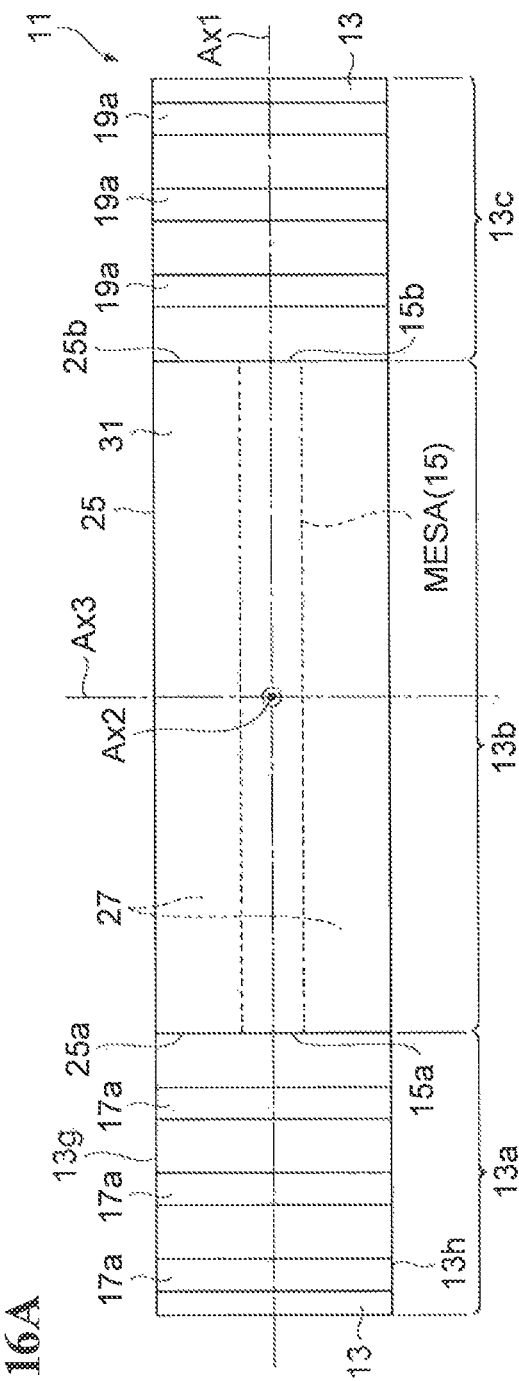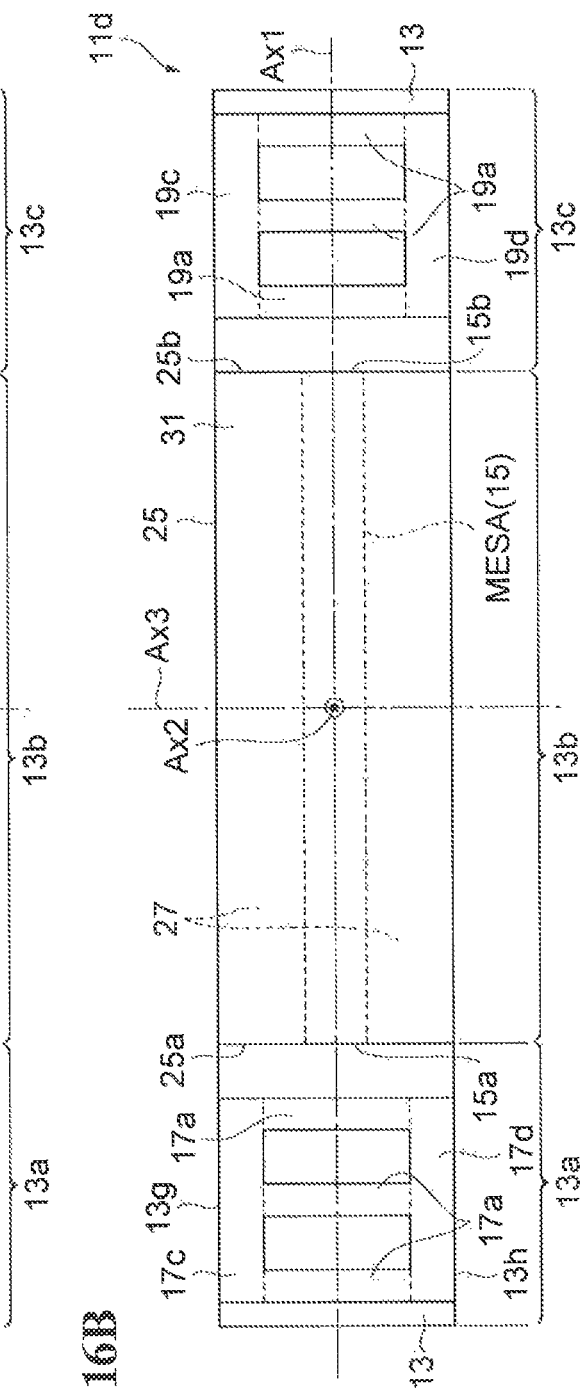
FIG. 16A
FIG. 16B

QUANTUM CASCADE LASER

BACKGROUND OF THE INVENTION

1. Field of the Invention

The present invention relates to a quantum cascade laser.

2. Description of the Related Art

Jpn. J. Appl. Phys., vol. 39, pp. L1297-1299, 2000 (Non-Patent Document 1), Journal of Modern Optics, vol. 52, No. 16, pp. 2303-2308, 2005 (Non-Patent Document 2), and Jpn. J. Appl. Phys., vol. 39, pp. 3406-3409, 2000 (Non-Patent Document 3) disclose quantum cascade lasers. In particular, Non-Patent Document 2 discloses a quantum cascade laser (QCL) including a mesa waveguide and a distributed Bragg reflector constituted by semiconductor/air. The distributed Bragg reflector reflects light emitted from the mesa waveguide.

SUMMARY OF THE INVENTION

In the production of the quantum cascade laser (QCL) including the distributed Bragg reflector as disclosed in Non-Patent Document 2, first, a stacked semiconductor layer for forming a mesa waveguide and a distributed Bragg reflector is grown on a substrate. Subsequently, the stacked semiconductor layer is etched to form the distributed Bragg reflector and the mesa waveguide, simultaneously.

The etching of the stacked semiconductor layer is performed until the etching reaches the substrate. The thickness of the stacked semiconductor layer is relatively large, and thus the etching depth increases. Therefore, when the distributed Bragg reflector and the QCL mesa waveguide are formed by etching, the production yield and the durability (mechanical strength) decrease due to, for example, damage to the side surface of the distributed Bragg reflector.

A quantum cascade laser according to one aspect of the present invention includes a substrate having a principal surface including a first region and a second region arranged along a first axis; a laser structure disposed on the principal surface in the second region of the substrate, the laser structure having an end facet intersecting the first axis, the laser structure including a stripe-shaped stacked semiconductor layer extending along the first axis; and a distributed Bragg reflection structure disposed on the principal surface in the first region of the substrate, the distributed Bragg reflection structure including a semiconductor wall made of a single semiconductor material, the distributed Bragg reflection structure being optically coupled to the end facet of the laser structure. The semiconductor wall has a first side surface and a second side surface opposite to the first side surface. The first side surface and the second side surface intersect the first axis and extend along a second axis intersecting the principal surface. In addition, the semiconductor wall is located away from the end facet of the laser structure.

Objects, features, and advantages according to embodiments of the present invention will be more easily understood from the following detailed descriptions of preferred embodiments according to the present invention with reference to the attached drawings.

BRIEF DESCRIPTION OF THE DRAWINGS

FIGS. 7A to 7D are sectional views illustrating a main process in the method for producing a quantum cascade laser according to the second embodiment.

FIGS. 8A to 8D are sectional views illustrating a main process in the method for producing a quantum cascade laser according to the second embodiment.

FIGS. 10A to 10D are sectional views illustrating a main process in the method for producing a quantum cascade laser according to the second embodiment.

FIGS. 15A and 15B schematically illustrate quantum cascade lasers according to a fifth embodiment.

FIGS. 16A and 16B schematically illustrate quantum cascade lasers according to a sixth embodiment.

DESCRIPTION OF THE PREFERRED EMBODIMENTS

Figure 1:
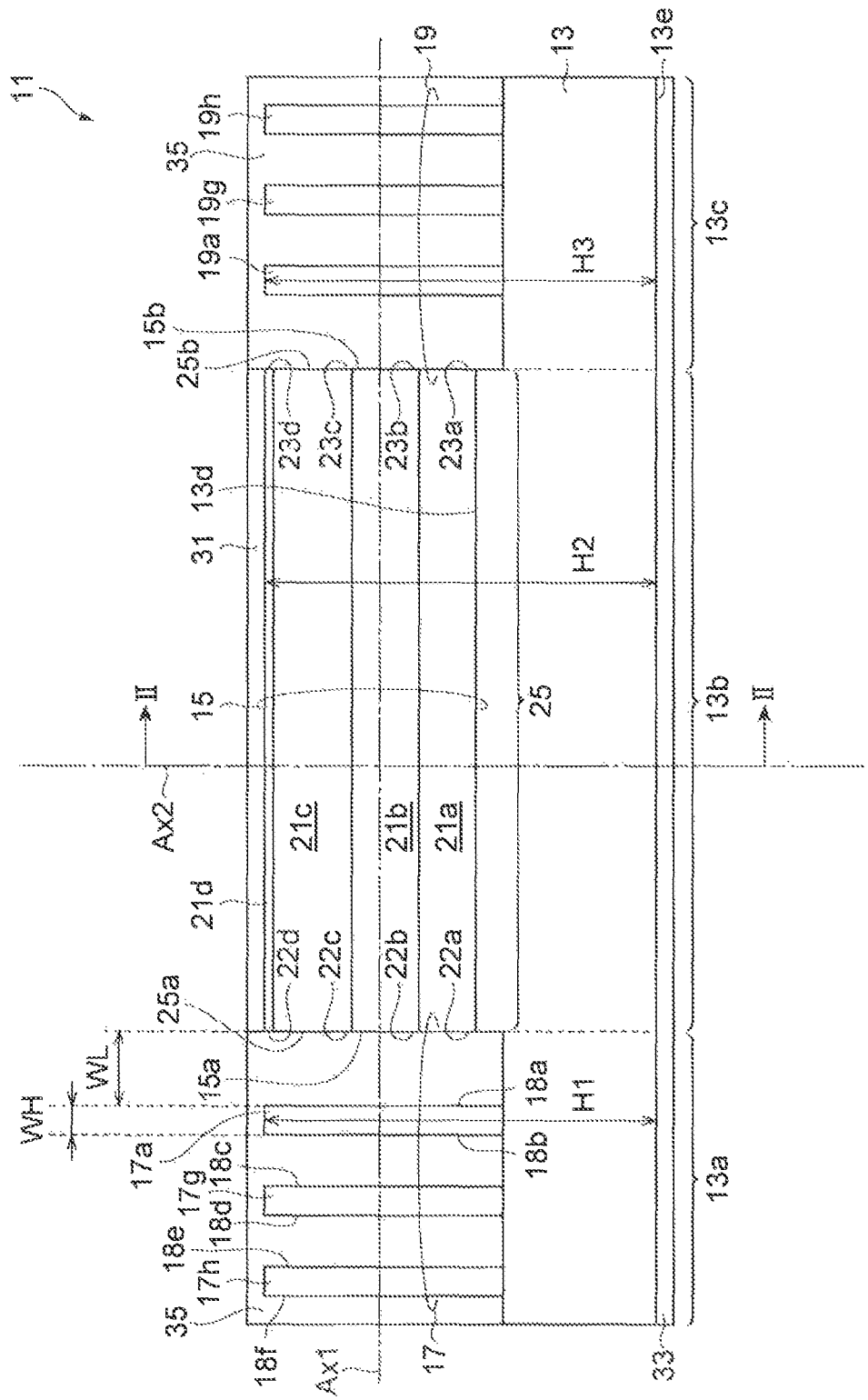
FIG. 1 schematically illustrates a quantum cascade laser according to a first embodiment.

Some embodiments will be described below.

A quantum cascade laser according to an embodiment includes (a) a substrate having a principal surface including a first region and a second region arranged along a first axis; (b) a laser structure disposed on the principal surface in the second region of the substrate, the laser structure having an end facet intersecting the first axis, the laser structure including a stripe-shaped stacked semiconductor layer extending along the first axis; and (c) a distributed Bragg reflection structure disposed on the principal surface in the first region of the substrate, the distributed Bragg reflection structure including a semiconductor wall made of a single semiconductor material, the distributed Bragg reflection structure being optically coupled to the end facet of the laser structure. The semiconductor wall has a first side surface and a second side surface opposite to the first side surface. The first side surface and the second side surface intersect the first axis and extend along a second axis intersecting the principal surface. In addition, the semiconductor wall is located away from the end facet of the laser structure.

In the quantum cascade laser according to an embodiment, preferably, the stripe-shaped stacked semiconductor layer includes a core layer and a cladding layer disposed on the core layer. In addition, the core layer and the cladding layer are exposed at the end facet of the laser structure.

According to this quantum cascade laser, the semiconductor wall forms a high-refractive-index portion in the distributed Bragg reflection structure. A region between the laser structure and the semiconductor wall forms a low-refractive-index portion having a refractive index lower than that of the high-refractive-index portion (semiconductor wall) in the distributed Bragg reflection structure. The semiconductor wall serving as the high-refractive-index portion of the distributed Bragg reflection structure is made of a single semiconductor material. Therefore, the mechanical strength (durability) of the quantum cascade laser is improved.

In addition, the distributed Bragg reflection structure is optically coupled to the end facet of the laser structure, and the end facet of the laser structure and the semiconductor wall of the distributed Bragg reflection structure constitute an optical reflection structure. A semiconductor region (referred to as a "single-layer semiconductor region") for forming the semiconductor wall of the distributed Bragg reflection structure is made of a single semiconductor material. By etching the single-layer semiconductor region for forming the distributed Bragg reflection structure, the semiconductor wall of the distributed Bragg reflection structure is made of a single semiconductor material. Therefore, the first side surface and the second side surface of the semiconductor wall have good flatness and verticality.

In the quantum cascade laser according to an embodiment, preferably, the end facet of the laser structure and the first and second side surfaces of the semiconductor wall are arranged along the first axis. The distributed Bragg reflection structure has a low-refractive-index portion disposed between the end facet of the laser structure and the first side surface and a high-refractive-index portion disposed between the first side surface and the second side surface. The low-refractive-index portion has a thickness along the first axis that is an odd multiple of $\lambda/(4 \times n1)$, and the high-refractive-index portion has a thickness along the first axis that is an odd multiple of $\lambda/(4 \times n2)$, where "$\lambda$" represents a lasing wavelength in vacuum, "n1" represents an effective refractive index of the low-refractive-index portion at the lasing wavelength, and "n2" represents an effective refractive index of the high-refractive-index portion at the lasing wavelength.

According to this quantum cascade laser, the reflectivity of the distributed Bragg reflection structure is increased by forming a distributed Bragg reflection structure including the low-refractive-index portion and the high-refractive-index portion that have the above-described thicknesses, respectively.

In the quantum cascade laser according to an embodiment, preferably, the distributed Bragg reflection structure includes one or more additional semiconductor walls. The distributed Bragg reflection structure further includes a first connecting portion that connects the semiconductor wall and the additional semiconductor walls or that connects the additional semiconductor walls with each other. In addition, the first connecting portion extends along the first axis.

According to this quantum cascade laser, the first connecting portion connects the semiconductor wall and the additional semiconductor wall so that the first connecting portion, the semiconductor wall, and the additional semiconductor walls are regarded as an integrated structure. By forming the first connecting portion, the mechanical strength of the distributed Bragg reflection structure increases. As a result, the production yield of the quantum cascade laser is improved.

In the quantum cascade laser according to an embodiment, preferably, the first connecting portion and the additional semiconductor walls are made of the same semiconductor material as the semiconductor wall.

According to this quantum cascade laser, the first connecting portion and the additional semiconductor walls are made of the same semiconductor material as the semiconductor wall. Therefore, the strength of the distributed Bragg reflection structure is improved. Furthermore, the first connecting portion, the additional semiconductor walls, and the semiconductor wall are formed at a time using the same material, and thus the production process for the distributed Bragg reflection structure may be simplified.

The quantum cascade laser according to an embodiment may further include a second connecting portion that connects the semiconductor wall and the laser structure. The second connecting portion extends along the first axis.

According to this quantum cascade laser, the second connecting portion connects the semiconductor wall and the laser structure so that the second connecting portion, the semiconductor wall, and the laser structure are regarded as an integrated structure. The second connecting portion increases the mechanical strength of the distributed Bragg reflection structure. As a result, the production yield of the quantum cascade laser is improved.

In the quantum cascade laser according to an embodiment, the second connecting portion may be made of the same semiconductor material as the semiconductor wall.

According to this quantum cascade laser, the second connecting portion and the semiconductor wall are made of the same semiconductor material. Therefore, the strength of the distributed Bragg reflection structure is improved. Furthermore, the second connecting portion and the semiconductor wall are formed at a time using the same material. As a result, the production process for the distributed Bragg reflection structure may be simplified.

In the quantum cascade laser according to an embodiment, preferably, the stripe-shaped stacked semiconductor layer includes a mesa waveguide. The laser structure includes a current blocking layer disposed on a side surface of the mesa waveguide and on the principal surface of the substrate. The current blocking layer is connected to the second connecting portion. In addition, the current blocking layer and the semiconductor wall are made of the same semiconductor material as the second connecting portion.

According to this quantum cascade laser, the laser structure includes the current blocking layer disposed on the side surface of the mesa waveguide and on the principal surface of the substrate. The current blocking layer is connected to the second connecting portion. All of the second connecting portion, the semiconductor wall, and the current blocking layer are made of the same semiconductor material. Therefore, the strength of the distributed Bragg reflection structure is improved. Furthermore, the second connecting portion, the semiconductor wall, and the current blocking layer are formed at a time using the same material. Therefore, the production process for the distributed Bragg reflection structure may be simplified.

In the quantum cascade laser according to an embodiment, preferably, the semiconductor material constituting the semiconductor wall is an undoped semiconductor or a semi-insulating semiconductor.

According to this quantum cascade laser, the undoped semiconductor or the semi-insulating semiconductor hardly absorbs light in a mid-infrared region due to free carrier absorption. Thus, the semiconductor wall made of an undoped semiconductor or a semi-insulating semiconductor does not pose a problem of light absorption due to free carriers. As a result, the effective reflectivity of the distributed Bragg reflection structure is improved.

In the quantum cascade laser according to an embodiment, preferably, the semiconductor wall has a top surface that is located higher than a top surface of the laser structure. According to this quantum cascade laser, the top surface of the semiconductor wall is located higher than the top surface of the laser structure. Therefore, a larger amount of light diverged from the end facet of the laser structure is reflected by the semiconductor wall. Therefore, the distributed Bragg reflection structure having high reflectivity is easily obtained.

In the quantum cascade laser according to an embodiment, preferably, the semiconductor wall has a top surface that is located lower than a top surface of the laser structure. According to this quantum cascade laser, when die bonding is performed in an epi-down configuration, physical damage to the semiconductor wall during mounting the quantum cascade laser chip on a sub-mount is avoided.

In the quantum cascade laser according to an embodiment, preferably, the semiconductor wall has a wall width along a third axis that intersects the first axis and the second axis. The substrate has a substrate width along the third axis. The wall width is smaller than the substrate width. According to this quantum cascade laser, the in-plane uniformity and reproducibility in the etching in the step of forming the semiconductor wall is improved.

In the quantum cascade laser according to an embodiment, preferably, the distributed Bragg reflection structure further includes one or more additional semiconductor walls and an embedded region that is disposed between the semiconductor wall and the end facet of the laser structure, between the semiconductor wall and the additional semiconductor wall, or between the additional semiconductor walls. The embedded region contains at least one of silicon dioxide, silicon oxy-nitride, silicon nitride, alumina, BCB resin, and polyimide resin. According to this quantum cascade laser, the embedded region of the distributed Bragg reflection structure is made of the material having a refractive index lower than that of a semiconductor. When the embedded region is formed using the above material, the mechanical strength of the distributed Bragg reflection structure is improved.

In the quantum cascade laser according to an embodiment, preferably, the distributed Bragg reflection structure further includes one or more additional semiconductor walls and a gap that is disposed between the semiconductor wall and the end facet of the laser structure, between the semiconductor wall and the additional semiconductor wall, or between the additional semiconductor walls. According to this quantum cascade laser, a gap formed of an air layer or the like constitutes the low-refractive-index portion.

The findings of the present invention can be easily understood from detailed descriptions below with reference to the attached drawings illustrating examples. Hereinafter, embodiments relating to a quantum cascade laser and a method for producing a quantum cascade laser according to embodiments of the present invention will be described with reference to the attached drawings. When possible, the same components are denoted by the same reference numerals.

First Embodiment

FIG. 1 schematically illustrates a quantum cascade laser (QCL) according to this embodiment. FIG. 1 illustrates a quantum cascade laser 11 including a distributed Bragg reflection structure. FIG. 1 is a sectional view taken in a direction in which an optical waveguide of the quantum cascade laser 11 extends. The quantum cascade laser 11 includes a substrate 13, a stacked semiconductor layer 15, a distributed Bragg reflection structure 17, and another distributed Bragg reflection structure 19. The substrate 13 includes a first region 13a, a second region 13b, and a third region 13c. The first region 13a, the second region 13b, and the third region 13c are arranged along a first axis Ax1 that indicates a direction in which the optical waveguide of the quantum cascade laser 11 extends. The substrate 13 has a principal surface 13d and a back surface 13e. Thus, each of the first region 13a, the second region 13b, and the third region 13c also has the principal surface 13d and the back surface 13e.

The stripe-shaped stacked semiconductor layer 15 constitutes a laser structure 25. The stacked semiconductor layer 15 extends in the first axis Ax1. The laser structure 25 is disposed on the principal surface 13d in the second region 13b of the substrate 13. The laser structure 25 has a first end facet 25a and a second end facet 25b. The first end facet 25a and the second end facet 25b each intersect the first axis Ax1 and extend along a second axis Ax2 that intersects the principal surface 13d. In this embodiment, the second axis Ax2 corresponds to a normal axis of the principal surface 13d.

The stacked semiconductor layer 15 is disposed on the principal surface 13d in the second region 13b of the substrate 13. The stacked semiconductor layer 15 has an end facet 15a (first end facet) and another end facet 15b (second end facet). These end facets 15a and 15b intersect the first axis Ax1. In the stacked semiconductor layer 15, the end facet 15a is located at a boundary between the first region 13a and the second region 13b. The other end facet 15b is located at a boundary between the second region 13b and the third region 13c. The stacked semiconductor layer 15 includes a lower cladding layer 21a, a core layer 21b, an upper cladding layer 21c, and a contact layer 21d. The lower cladding layer 21a, the core layer 21b, and the upper cladding layer 21c constitute an optical waveguide of the quantum cascade laser 11. The lower cladding layer 21a, the core layer 21b, the upper cladding layer 21c, and the contact layer 21d are arranged along the second axis Ax2. The lower cladding layer 21a, the core layer 21b, the upper cladding layer 21c, and the contact layer 21d extend from the other end facet 15b to the end facet 15a. Therefore, the end facet 15a of the stacked semiconductor layer 15 includes an end facet 22a of the lower cladding layer 21a, an end facet 22b of the core layer 21b, an end facet 22c of the upper cladding layer 21c, and an end facet 22d of the contact layer 21d. The other end facet 15b of the stacked semiconductor layer 15 includes an end facet 23a of the lower cladding layer 21a, an end facet 23b of the core layer 21b, an end facet 23c of the upper cladding layer 21c, and an end facet 23d of the contact layer 21d.

Example of Stacked Semiconductor Layer 15

Lower cladding layer 21a: Si-doped n-type InP

Core layer 21b: quantum well structure in which well layers made of GaInAs and barrier layers made of AlInAs are alternately stacked
Upper cladding layer 21c: Si-doped n-type InP
Contact layer 21d: Si-doped n-type GaInAs
Substrate 13: n-type InP The substrate 13 is an n-InP substrate, for example. The semiconductor layers included in the stacked semiconductor layer 15 are constituted of materials substantially lattice-matched to the InP substrate. Therefore, the semiconductor layers are epitaxially grown on the InP substrate so as to have good crystal quality. In addition, the substrate needs to have electrical conductivity for the purpose of injecting electric current into the QCL. In the QCL, since electrons are used as carriers as described later, an n-InP substrate is preferably used in terms of conductivity type. InP is transparent to the light of a mid-infrared wavelength range and hardly absorbs light of this mid-infrared wavelength range. Therefore, InP is used for an upper cladding layer disposed on the core layer and a lower cladding layer disposed below the core layer. Herein, the lower cladding layer is not necessarily disposed. The lower cladding layer may be omitted as long as the substrate is made of a material (e.g., InP) transparent to light emitted from the QCL and the substrate also serves as the lower cladding layer. InP is a binary crystal, and thus crystal growth and a treatment using etching are easily performed. InP also has a relatively large thermal conductivity. Therefore, good heat dissipation is imparted to the quantum cascade laser by using InP for the cladding layer of the quantum cascade laser.

In the core layer, several tens of unit structures each constituted by an active layer and an injection layer are periodically stacked so as to form a structure in which the active layers and the injection layers are alternately connected to each other in a multilayered manner. The core layer has a thickness of several micrometers (e.g., 1 to 3 μm). Each of the active layers and the injection layers includes well layers with a thickness of several nanometers and barrier layers with a thickness of several nanometers. The barrier layer has a bandgap energy higher than that of the well layer. Several hundred well layers and barrier layers are alternately stacked to constitute a super-lattice structure.

When a particular electric filed is generated in the core layer by applying voltage to the core layer, an electron transfer path constituted by subband levels in the core layer is formed in the core layer. In this electron transfer path, electrons serving as carriers are injected into an upper level of the active layer on the high-potential side by the electric filed. Subsequently, the electrons injected into the upper level undergo transition to a lower level. As a result of this transition, light with a wavelength corresponding to the difference in energy between the two levels is generated. After the transition, the electrons relax from the lower level to a relaxation level due to the release of longitudinal optical (LO) phonons, followed by electron transfer to the adjacent unit structure through the injection layer. Such electron transition for light emission and electron transfer repeatedly occur in each of unit structures connected in a multilayered manner. The difference in energy between the upper level and the lower level is controlled in accordance with the material compositions and thicknesses of the well layer and the barrier layer that constitute the active layer, and thus light having a wavelength of about 3 to 20 μm in an infrared region is generated. To achieve infrared light emission, for example, the well layer is made of GaInAs and the barrier layer is made of AlInAs.

A contact layer 21d is disposed in order to achieve good ohmic contact with an upper electrode. The contact layer is made of, for example, GaInAs, that has a low bandgap energy and is lattice-matched to an InP substrate. When good ohmic contact with an upper electrode is achieved without the contact layer, the contact layer may be omitted. Furthermore, an optical confinement layer for strengthening the confinement of guided light in the core layer may be optionally disposed on and below (on or below) the core layer. The optical confinement layer is made of a material, such as undoped GaInAs or n-type GaInAs, that has a refractive index higher than that of the cladding layer (lower cladding layer or upper cladding layer) and that is lattice-matched to an InP substrate.

The distributed Bragg reflection structure 17 (first distributed Bragg reflection structure) is disposed on the principal surface 13d in the first region 13a of the substrate 13. The other distributed Bragg reflection structure 19 (second distributed Bragg reflection structure) is disposed on the principal surface 13d in the third region 13c of the substrate 13. The end facet 15a of the stacked semiconductor layer 15 is optically coupled to the distributed Bragg reflection structure 17. The other end facet 15b of the stacked semiconductor layer 15 is optically coupled to the other distributed Bragg reflection structure 19. In this embodiment, the distributed Bragg reflection structure 19 may have reflection characteristics different from those of the distributed Bragg reflection structure 17. However, the distributed Bragg reflection structure 19 has substantially the same structure as the distributed Bragg reflection structure 17, except for the difference in optical characteristics. Subsequently, the distributed Bragg reflection structure 17 will be described. The quantum cascade laser 11 in FIG. 1 includes a Fabry-Perot type cavity having two end facets that are constituted by distributed Bragg reflection structures. When necessary, for example, the quantum cascade laser may include a Fabry-Perot type cavity in which one of the end facets is a cleaved facet and the other of the end facets is constituted by a distributed Bragg reflection structure.

The distributed Bragg reflection structure 17 (distributed Bragg reflection structure 19) includes a semiconductor wall 17a (semiconductor wall 19a). The semiconductor wall 17a (semiconductor wall 19a) extends along the second axis Ax2. The semiconductor wall 17a (19a) is disposed away from the first end facet 25a (second end facet 25b) of the laser structure 25.

Example of the Distributed Bragg Reflection Structure 17 (19)

Semiconductor Wall 17a (19a): Semi-Insulating InP or Undoped InP

The semiconductor wall 17a (semiconductor wall 19a) has a first side surface 18a (20a) and a second side surface 18b (20b). The first side surface 18a (20a) and the second side surface 18b (20b) each intersect the first axis Ax1 and extend along the second axis Ax2. The first end facet 25a (second end facet 25b) of the laser structure 25 is located away from the first side surface 18a (20a) and the second side surface 18b (20b) of the semiconductor wall 17a (semiconductor wall 19a). The semiconductor wall 17a (19a) is made of a single semiconductor material. Therefore, the first side surface 18a and the second side surface 18b of the semiconductor wall 17a are also made of a single semiconductor material. Similarly, the first side surface 20a and the second side surface 20b of the semiconductor wall 19a are also made of a single semiconductor material.

In this quantum cascade laser 11, the distributed Bragg reflection structure 17 (19) is optically coupled to the end facet 15a (15b) of the stacked semiconductor layer 15. The first end facet 25a (25b) of the laser structure 25 and the semiconductor wall 17a (19a) constitute a distributed Bragg reflection structure. A semiconductor region (referred to as a "single-layer semiconductor region") for forming the semiconductor wall 17a (19a) of the distributed Bragg reflection structure 17 (19) is made of a single semiconductor material. In the step of forming the distributed Bragg reflection structure 17 (19), the single semiconductor material is etched. Therefore, irregularities due to side etching and anisotropic etching are not formed on the etched surface. Especially, the side etching occurs on the etched surface in etching the stacked semiconductor layers including a plurality of semiconductor layers. The side etching is effectively avoided by using the semiconductor wall 17a (19a) made of a single semiconductor material. Thus, the first side surface 18a and the second side surface 18b of the semiconductor wall 17a have excellent flatness and verticality. Before the laser structure 25 and the distributed Bragg reflection structure 17 (19) are formed by etching, the single-layer semiconductor region and a multilayer semiconductor region for forming the stacked semiconductor layer are joined by a butt-joint structure. After the etching, the side surface of the semiconductor wall 17a (19a) is disposed away from the position of the butt-joint structure. In addition, the first end facet 25a (second end facet 25b) of the laser structure 25 is also disposed away from the position of the butt-joint structure. In other words, the side surface of the semiconductor wall 17a (19a) and the first end facet 25a (second end facet 25b) of the laser structure 25 are disposed away from the position of the butt-joint structure. As described above, the single-layer semiconductor region is grown on a side surface of the multilayer semiconductor region so as to form the butt-joint structure. An abnormal crystal growth occurs at near the butt-joint structure. In the embodiment, the end facet of the laser structure 25 and the side surface of the semiconductor wall 17a (19a) have a flat surface without any influence by the abnormal crystal growth.

The semiconductor wall 17a (19a) is made of a single semiconductor material. Thus, when the laser structure 25 and the distributed Bragg reflection structure 17 (19) are formed by etching, the first side surface 18a (20a) and second side surface 18b (20b) of the semiconductor wall 17a (19a) having good planarity and verticality are obtained. As a result, the distributed Bragg reflection structure 17 (19) has high reflectivity.

The single semiconductor material for the semiconductor wall 17a (19a) may be an undoped semiconductor such as undoped InP or a semi-insulating semiconductor such as Fe-doped InP. The undoped semiconductor and the semi-insulating semiconductor cause only a small amount of light absorption due to free carriers (free electrons) in a mid-infrared region. Thus, the semiconductor wall made of an undoped semiconductor or a semi-insulating semiconductor hardly absorbs light in a mid-infrared region. Specifically, the distributed Bragg reflection structure maintains high reflectivity because of low light absorption in the semiconductor wall.

Figure 2:
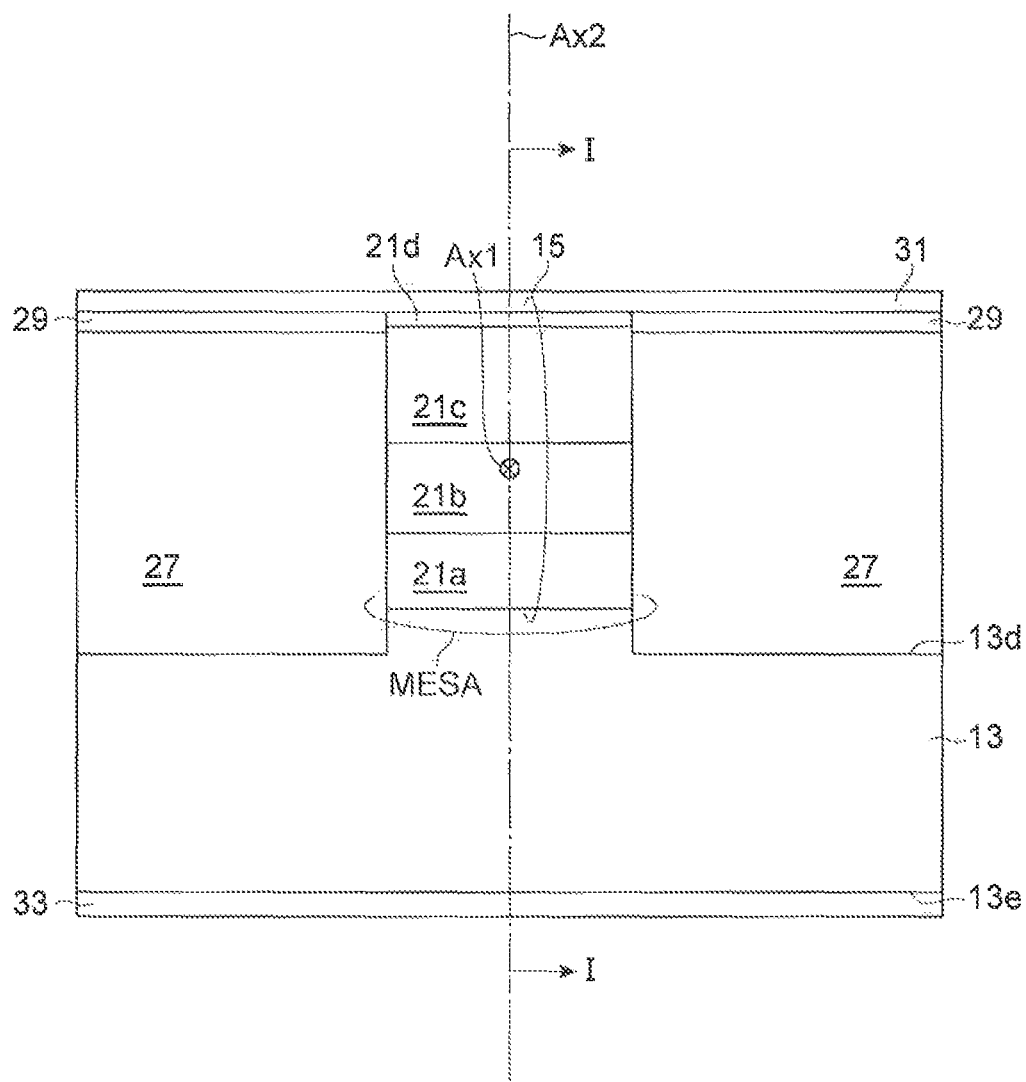
FIG. 2 is a sectional view of the quantum cascade laser taken along line II-II of FIG. 1.

FIG. 2 is a sectional view of the quantum cascade laser taken along line II-II of FIG. 1. FIG. 1 is a sectional view of the quantum cascade laser taken along line I-I of FIG. 2. The laser structure 25 includes a current blocking layer 27 for confining electric current. The current blocking layer 27 is formed on side surfaces of a stripe-shaped stacked semiconductor layer 15 (semiconductor mesa waveguide MESA) and on the principal surface 13d of the substrate 13. The upper surface of the current blocking layer 27 is covered with an insulating layer 29. The insulating layer 29 is, for example, a silicon-based inorganic insulating layer made of silicon nitride (SiN) or silicon dioxide ($SiO_2$), for example. An upper electrode 31 is disposed on the stacked semiconductor layer 15 and the insulating layer 29. The upper electrode 31 is in contact with the contact layer 21d in the stacked semiconductor layer 15 through an opening of the insulating layer 29. A backside electrode 33 is disposed on the back surface 13e of the substrate 13. The backside electrode 33 is in contact with the back surface 13e of the substrate 13.

Example of Current Blocking Structure

Current blocking layer 27: semi-insulating InP or undoped InP

Insulating layer 29: silicon nitride (SiN) or silicon dioxide ($SiO_2$)

Upper electrode 31: Ti/Au or Ge/Au

Backside electrode 33: Ti/Au or Ge/Au

In the distributed Bragg reflection structure 17 of the quantum cascade laser 11, the first end facet 25a, the first side surface 18a, and the second side surface 18b are arranged in that order along the first axis Ax1. Hereafter, the distributed Bragg reflection structure 17 will be described. The distributed Bragg reflection structure 19 has the same configuration as the distributed Bragg reflection structure 17. A region between the semiconductor wall 17a and the first end facet 25a of the laser structure 25 along the first axis Ax1 functions as a low-refractive-index portion of the distributed Bragg reflection structure 17. The semiconductor wall 17a functions as a high-refractive-index portion of the distributed Bragg reflection structure 17. The distance between the semiconductor wall 17a and the laser structure 25 along the first axis Ax1 (e.g., the distance between the first end facet 25a and the first side surface 18a) is an odd multiple of $\lambda/(4 \times n1)$. The thickness of the semiconductor wall 17a along the first axis Ax1 (e.g., the distance between the first side surface 18a and the second side surface 18b) is an odd multiple of $\lambda/(4 \times n2)$. Herein, "$\lambda$" represents a lasing wavelength in vacuum of the quantum cascade laser 11, "n1" represents an effective refractive index of the low-refractive-index portion at the lasing wavelength $\lambda$, and "n2" represents an effective refractive index of the high-refractive-index portion at the lasing wavelength $\lambda$. In this quantum cascade laser 11, when the distributed Bragg reflection structure 17 (19) has the above-described distances, the reflectivity of the distributed Bragg reflection structure 17 (19) is maximized.

The distributed Bragg reflection structure 17 (19) may include one or more additional semiconductor walls that constitute a high-refractive-index portion in the distributed Bragg reflection structure 17 (19) and that are made of a single semiconductor material. FIG. 1 illustrates, for example, a structure in which two additional semiconductor walls 17g (19g) and 17h (19h) are added to the distributed Bragg reflection structure 17 (19). The additional semiconductor wall 17g (19g) has a third side surface 18c (20c) and a fourth side surface 18d (20d). The additional semiconductor wall 17h (19h) has a fifth side surface 18e (20e) and a sixth side surface 18f (20f). In the distributed Bragg reflection structure 17 (19) having the additional semiconductor walls, regions between two adjacent semiconductor walls, that is, a region between the semiconductor wall 17a (19a) and the additional semiconductor wall 17g (19g) and a region between the additional semiconductor wall 17g (19g) and the additional semiconductor wall 17h (19h) constitute low-refractive-index portions in the distributed Bragg reflection structure 17 (19). The number of the additional semiconductor walls in the distributed Bragg reflection structure 17 (19) is related to the reflectivity of the distributed Bragg reflection structure. As the number of the additional semiconductor walls increases, the reflectivity of the distributed Bragg reflection structure increases. The thickness of the semiconductor wall 17a (19a) and the additional semiconductor walls 17g (19g) and 17h (19h) each serving as a high-refractive-index portion in a direction of the first axis Ax1 is adjusted to a thickness that achieves high reflection with respect to the lasing wavelength λ, such as a thickness of the odd multiple of $\lambda/(4 \times n2)$. The distance of a region between the semiconductor wall 17a (19a) and the first end facet 25a (second end facet 25b) of the laser structure 25 and regions of two adjacent semiconductor walls, that is, a region between the semiconductor wall 17a (19a) and the additional semiconductor wall 17g (19g) and a region between the additional semiconductor wall 17g (19g) and the additional semiconductor wall 17h (19h) each serving as a low-refractive-index portion in a direction of the first axis Ax1 is adjusted to be a distance that achieves high reflection with respect to the lasing wavelength λ, such as a distance of the odd multiple of $\lambda/(4 \times n1)$. The semiconductor wall 17a (19a), and the additional semiconductor walls 17g (19g) and 17h (19h) are made of a single semiconductor material. When the semiconductor wall 17a (19a), and the additional semiconductor walls 17g (19g) and 17h (19h) are formed by etching, side surfaces with good planarity and verticality are formed. The first end facet 25a, the second side surface 18b, the fourth side surface 18d, and the sixth side surface 18f are periodically arranged. The first side surface 18a, the third side surface 18c, and the fifth side surface 18e are periodically arranged. The additional semiconductor walls 17g (19g) and 17h (19h) are formed substantially in the same manner as that of the semiconductor wall 17a (19a). Therefore, to facilitate the understanding, the additional semiconductor walls 17g (19g) and 17h (19h) are collectively referred to as the semiconductor walls 17a (19a) in the following description.

In the quantum cascade laser 11, the distributed Bragg reflection structure 17 (19) may further include an embedded region 35. The embedded region 35 is disposed in the low-refractive-index portion between the semiconductor wall 17a (19a) and the first end facet 25a (second end facet 25b) of the laser structure 25. The embedded region 35 may contain at least one of silicon dioxide ($SiO_2$), silicon oxynitride (SiON), silicon nitride (SiN), alumina ($Al_2O_3$), benzocyclobutene (BCB) resin, and polyimide resin. In this quantum cascade laser 11, the material for the embedded region 35 of the distributed Bragg reflection structure has a refractive index lower than that of the semiconductor used for the semiconductor wall 17a (19a).

Alternatively, an air gap may be formed in the low-refractive-index portion between the first end facet 25a (second end facet 25b) and the semiconductor wall 17a (19a). Similarly, an air gap may be formed in the low-refractive-index portion between the semiconductor wall 17a (19a) and the additional semiconductor wall 17g (19g) and between the additional semiconductor wall 17g (19g) and the additional semiconductor wall 17h (19h). In the distributed Bragg reflection structure 17 (19) of the quantum cascade laser 11, the air gap has a refractive index lower than that of the semiconductor used for the semiconductor wall 17a (19a).

As described above, in the direction of the first axis Ax1, a laser main body including the laser structure 25 is disposed in a central portion of the quantum cascade laser 11, and the distributed Bragg reflection structure 17 (19) is disposed near each of end portions of the quantum cascade laser 11. The height H1 of the semiconductor wall 17a, the height H2 of the stacked semiconductor layer 15 from the bottom to the uppermost surface (n-type contact layer), and the height H3 of the semiconductor wall 19a are substantially the same height. These heights H1, H2, and H3 are measured from the back surface 13e of the substrate to the uppermost surface of each of the semiconductor wall 17a, the stacked semiconductor layer 15 and the semiconductor wall 19a.

A preferred embodiment will be described. The semi-insulating semiconductor is made of, for example, InP, GaInAs, AlInAs, GaInAsP, and AlGaInAs doped with a transition metal of Fe, Ti, Cr, or Co. These transition metals form a deep level that traps electrons in the forbidden band of the semiconductor material. Therefore, the semiconductor material doped with these transition metals has a high resistivity so as to become a semi-insulating III-V compound semiconductor. A suitable transition metal is, for example, Fe. The semi-insulating III-V compound semiconductor doped with the transition metal (for example, Fe) has a resistivity of $10^5$ Ωcm or more against electrons. Therefore, the semi-insulating semiconductor containing a transition metal is used for a current blocking layer. Furthermore, an undoped semiconductor also has a relatively high resistivity, and thus is used for a current blocking layer. For example, InP, GaInAs, AlInAs, GaInAsP, and AlGaInAs are used for the undoped semiconductor. In the undoped semiconductor and semi-insulating semiconductor, the concentration of free carriers (here, electrons) is low, and thus mid-infrared light is hardly absorbed in these undoped semiconductor and semi-insulating semiconductor. Furthermore, the semiconductor materials such as InP, GaInAs, AlInAs, GaInAsP, and AlGaInAs have a relatively large bandgap and are transparent to mid-infrared light. Therefore, light absorption caused by subband transition, which is a main light absorption mechanism of mid-infrared light other than the free carrier absorption, also does not occur. Accordingly, when a semiconductor such as the undoped or semi-insulated InP, GaInAs, AlInAs, GaInAsP, AlGaInAs, or the like is used for a current blocking layer, the light absorption caused by free carriers and subband transition in the current blocking layer is effectively suppressed. As a result, good lasing characteristics are maintained. Furthermore, the undoped semiconductor and the semi-insulating semiconductor have high thermal conductivity. When the undoped semiconductor or the semi-insulating semiconductor is used for a current blocking layer, the heat dissipation in the quantum cascade laser (QCL) is improved, which allows a high-temperature operation. In particular, an InP semiconductor has the high thermal conductivity among semiconductor materials that are used for a mid-infrared quantum cascade laser. By employing the InP semiconductor as the current blocking layer, high heat dissipation is achieved for the quantum cascade laser (QCL). Herein, other semiconductors such as AlInAs and AlGaInAs may be used in addition to or instead of the InP semiconductor. AlInAs and AlGaInAs have a bandgap larger than that of InP. When they are applied to a current blocking layer, the energy discontinuity (energy discontinuity at a conduction band edge) at an interface between the mesa waveguide and the current blocking layer is increased compared with the current blocking layer made of InP. This provides a large energy barrier (energy barrier against electrons) at the interface between the mesa waveguide and the current blocking layer. In this form, the leakage of electrons from the mesa waveguide to the current blocking layer is further reduced due to not only high resistivity in the current blocking layer but also the increase in energy barrier.

The insulating layer 29 on the current blocking layer 27 is made of a dielectric material such as $SiO_2$, SiON, SiN, and alumina, or a resin such as BCB resin and polyimide resin. These materials exhibit excellent durability and insulating properties for a protective film in a semiconductor device and are easily formed into a film. The insulating layer is not necessarily disposed, and may be omitted when sufficient current confinement in the mesa waveguide is achieved by using only the current blocking layer 27.

The semiconductor wall 17a (19a), and the additional semiconductor walls 17g (19g) and 17h (19h) in the distributed Bragg reflection structure 17 (19) serve as high-refractive-index portions in the distributed Bragg reflection structure. The regions between these walls serve as low-refractive-index portions in the distributed Bragg reflection structure. Each of the low-refractive-index portions has a refractive index lower than that of a semiconductor in each of the high-refractive-index portions. Specifically, the low-refractive-index portion may be an air gap to include gas such as air between the walls. Alternatively, the low-refractive-index portion may be an embedded region filled with a substance having a refractive index lower than that of a semiconductor in the high-refractive-index portion. For example, the embedded region is made of a dielectric material such as silicon dioxide ($SiO_2$), silicon oxy-nitride (SiON), silicon nitride (SiN), and alumina ($Al_2O_3$), or a resin such as BCB resin and polyimide resin. The low-refractive-index portion may be constituted by a combination of the air gap and the embedded region. When the low-refractive-index portion is an air gap, the difference in refractive index between the high-refractive-index portion and the low-refractive-index portion is maximized, which easily achieves high reflectivity for the distributed Bragg reflection structure. When an embedded region filled with a dielectric material or the like is used for the low-refractive-index portion, the material for the embedded region protects the surfaces of the semiconductor wall made of a single semiconductor material and prevents the degradation of the surface due to oxidation described later. Furthermore, when the embedded region is used as the low-refractive-index portion, the semiconductor wall is supported by the material for the embedded region, which improves the mechanical strength of the distributed Bragg reflection structure 17 (19).

Herein, the advantages of the quantum cascade laser according to this embodiment over conventional quantum cascade lasers will be described. In a conventional quantum cascade laser, the semiconductor walls of the distributed Bragg reflection structure are formed of the same plurality of semiconductor layers as those such as a core layer and a cladding layer that constitute the stacked semiconductor layer. Except for the above structure, the conventional quantum cascade laser has the same structure as that shown in FIG. 1. Therefore, in the conventional quantum cascade laser, the semiconductor wall of the distributed Bragg reflection structure includes a core layer. As described above, the core layer includes the multi-quantum well (MQW) structure in which well layers and barrier layers are alternately stacked. The number of layers in the MQW structure is several hundreds or more. The core layer has a large thickness of several micrometers. In addition, the well layer is made of GaInAs and the barrier layer is made of AlInAs, for example. These well layer and barrier layer are made of materials different from the material for the substrate. In this case, the lattice strain of each semiconductor layer constituting the core layer with respect to the substrate is small. However, in the core layer, many semiconductor layers are stacked so as to have a large thickness as described above. Therefore, a large stress is generated. When the semiconductor wall includes the same semiconductor layers as that of the core layer, crystal deterioration such as cracking or film detachment is caused in the semiconductor layers of the semiconductor wall due to the above-described stress. These cracking and film detachment of the semiconductor layers decrease the mechanical strength of the semiconductor wall. The semiconductor wall has a small width on the order of submicrometers to micrometers in a direction of the first axis Ax1 as described later. Therefore, the crystal deterioration easily introduces mechanical damage to the semiconductor wall during the processing of the quantum cascade laser. Such degradation of the semiconductor wall in the distributed Bragg reflection structure decreases the production yield and durability of the quantum cascade lasers.

Furthermore, in the conventional quantum cascade laser, the laser main body and the semiconductor walls are simultaneously formed by etching a plurality of semiconductor layers until reaching the substrate, the semiconductor layers extending along the first axis Ax1 and being made of different materials. Therefore, in the conventional quantum cascade laser, the end facets of the plurality of semiconductor layers including a core layer and a cladding layer are exposed at the end facet (end facet formed by etching) of the laser main body and at the side surfaces (side surfaces formed by etching) of the semiconductor walls in the high-refractive-index portion of the distributed Bragg reflection structure. However, if these semiconductor layers are etched under the same etching conditions, the etching is not uniformly performed because the semiconductor layers have different etching rates and etching directions. As a result of nonuniform etching such as side etching at interfaces between different semiconductor layers and anisotropic etching, irregularities and steps are easily formed at the side surfaces of the semiconductor walls in the high-refractive-index portion. In particular, in the embodiment, the quantum cascade laser emits light having a long wavelength of about 3 to 20 μm. Light propagating in the core layer is widely distributed to the cladding layer and the substrate which are located outside the core layer. Therefore, to achieve high reflectivity in the distributed Bragg reflection structure, the etching depth of the semiconductor layers in a direction of the second axis Ax2 needs to be as large as about 5 to 10 μm so that the etching reaches the middle of the substrate. Thus, irregularities are easily formed more considerably at the side surfaces of the semiconductor walls in the high-refractive-index portion as a result of the nonuniform etching. Such irregularities impair the verticality at the side surfaces of the semiconductor walls in the distributed Bragg reflection structure. This decreases the effective reflectivity of the distributed Bragg reflection structure. For example, if the side surfaces of the semiconductor walls are inclined about 5 degrees with respect to the reference plane vertical to the waveguide axis (first axis Ax1), the effective reflectivity of the distributed Bragg reflection structure significantly decreases from 85% (theoretical value) to 30% (measured value). This makes it difficult to achieve high reflectivity using the distributed Bragg reflection structure in the conventional quantum cascade laser. To prevent the degradation of verticality, appropriate etching conditions need to be selected on the semiconductor layers such as a core layer and a cladding layer that are included in the laser main body and the semiconductor walls in the distributed Bragg reflection structure. However, setting different etching conditions for the semiconductor layers requires much effort. Even if an appropriate etching condition is found for each of the semiconductor layers, whether the verticality of the end facet is achieved with certainty is unclear. Even if the verticality is achieved with certainty, it is difficult to achieve practical use because the etching process is complicated and the productivity is decreased.

In the conventional quantum cascade laser, as described above, the semiconductor walls in the distributed Bragg reflection structure are constituted by the semiconductor layers having the same configuration as that of the stacked semiconductor layer in the laser main body. Therefore, the semiconductor walls are formed of layers that absorb light emitted from the core layer in the laser main body. For example, the semiconductor walls include the highly doped contact layer and cladding layer having large free carrier absorption and the core layer having large light absorption due to subband transition of the conduction band. Due to the absorption of light in the semiconductor walls, the effective reflectivity of the distributed Bragg reflection structure is decreased.

On the other hand, in the embodiment, the semiconductor wall 17a (19a) and the additional semiconductor walls 17g (19g) and 17h (19h) are made of a single semiconductor layer and do not include a core layer. Therefore, damage to the semiconductor wall due to the crystal deterioration of the core layer during the processing of the semiconductor wall is avoided. The production yield and durability of the quantum cascade having the distributed Bragg reflection structure are improved.

In the production of the distributed Bragg reflection structure 17 (19) of the quantum cascade laser in this embodiment, the semiconductor wall 17a (19a), and the additional semiconductor walls 17g (19g) and 17h (19h) are formed by etching, but they are made of a single semiconductor material such as InP. Therefore, irregularities on the etched side surfaces due to nonuniform etching, such as side etching, are not formed in the quantum cascade laser according to this embodiment. Hence, the side surfaces of the semiconductor wall 17a (19a) and the additional semiconductor walls 17g (19g) and 17h (19h) have good planarity and verticality. Consequently, the high effective reflectivity of the distributed Bragg reflection structure is maintained for the quantum cascade laser according to this embodiment. In the embodiment, all of the semiconductor wall 17a (19a), and the additional semiconductor walls 17g (19g) and 17h (19h) are made of a single semiconductor. Therefore, etching is performed under an optimum single etching condition.

Furthermore, the light absorption caused by free carriers in a mid-infrared region is reduced by using a semi-insulating or undoped semiconductor such as InP, GaInAs, AlInAs, GaInAsP, or AlGaInAs as the single semiconductor material. These semiconductor materials are transparent to mid-infrared light emitted from the quantum cascade laser 11, and thus the light absorption caused by subband transition is also reduced. Hence, a decrease in the effective reflectivity of the distributed Bragg reflection structure due to the light absorption caused by free carriers and subband transition is avoided by using the semiconductor material for the semiconductor wall 17a (19a), and the additional semiconductor walls 17g (19g) and 17h (19h). Consequently, the distributed Bragg reflection structure having high reflectivity is easily achieved.

More specifically, a semiconductor region made of a single semiconductor material is prepared in order to form the distributed Bragg reflection structure 17 (19). When the semiconductor region is etched, the etchant always continues to etch the single semiconductor material. Therefore, in this etching, side etching between different semiconductor layers does not occur and anisotropic etching caused by the material dependence of etching directions also does not occur. Furthermore, this etching is performed under an optimum single etching condition in which the single semiconductor is vertically etched.

In the quantum cascade laser 11, the semiconductor walls of the distributed Bragg reflection structure 17 (19) are made of a single semiconductor with high resistivity. The single semiconductor material with high resistivity may contain, for example, the above-described semi-insulating or undoped semiconductor such as InP, GaInAs, AlInAs, GaInAsP, or AlGaInAs.

In the above structure of the quantum cascade laser (QCL), electrons are used as carriers, but holes may be used as carriers. In this case, the n-type semiconductor layers and the n-type substrate illustrated in FIG. 1 are changed to p-type semiconductor layers and a p-type substrate.

The specifications of the structure of the distributed Bragg reflection structure 17 (19) have been studied. In order to obtain the distributed Bragg reflection structure having high reflectivity, the distance WL of a region between two adjacent semiconductor walls and a region between the side surface of the semiconductor wall and the end facet (first end facet 25a or second end facet 25b) of the laser structure 25, and the thickness WH of each semiconductor wall serving as the high-refractive-index portion are desirably set to an odd multiple of $\lambda/(4\times n)$ as described above. Here, the region between two adjacent semiconductor walls and the region between the side surface of the semiconductor wall and the end facet of the laser structure 25 serve as the low-refractive-index portion in the distributed Bragg reflection structure. In many cases, the distance and the thickness are set to $\lambda/(4\times n)$ or $3\times\lambda/(4\times n)$. Herein, "$\lambda$" represents a lasing wavelength in vacuum and "n" represents an effective refractive index in each region (high-refractive-index region and low-refractive-index region) at the corresponding lasing wavelength.

Next, the effective reflectivity of the distributed Bragg reflection structure will be calculated using, as a calculation model, a distributed Bragg reflection structure that satisfies the following conditions.

(1) A quantum cascade laser of the calculation model includes an Fe—InP buried heterostructure and has a lasing wavelength of 7.54 μm.

(2) The distributed Bragg reflection structure and the laser structure have end facets and side surfaces with ideal verticality and flatness not subjected to side etching or the like. The high-refractive-index portion (semiconductor wall and additional semiconductor walls) of the distributed Bragg reflection structure is made of an Fe—InP semi-insulating semiconductor. The low-refractive-index portion is constituted by an air gap filled with air. Based on this structure, there is assumed to be no light absorption caused by the distributed Bragg reflection structure.

Figures 3A, 3B:
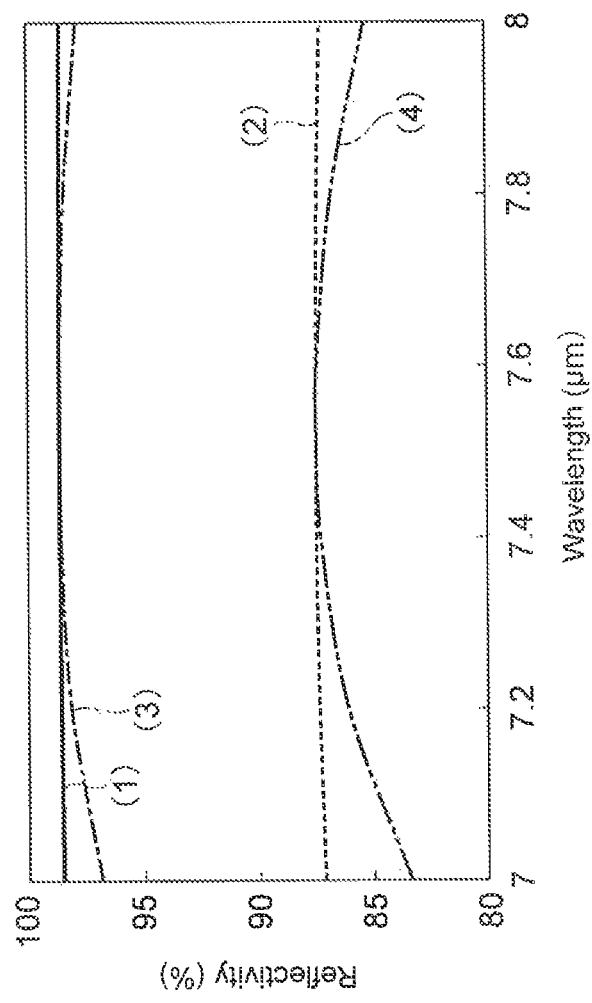
FIGS. 3A and 3B show the calculation results of reflectivity according to a distributed Bragg reflection structure.

(3) The thickness WH of each semiconductor wall serving as the high-refractive-index portion and the distance WL of the low-refractive-index portion constituted by air are set to the above-described odd multiple of $\lambda/(4\times n)$, which is an optimum value for achieving high reflectivity of the distributed Bragg reflection structure. Specifically, the thickness WH of each semiconductor wall and the distance WL of the low-refractive-index portion are set to a value of $\lambda/(4\times n)$ or $3\times\lambda/(4\times n)$. Hereafter, the former is referred to as a $\lambda/(4\times n)$ structure and the latter is referred to as a $3\times\lambda/(4\times n)$ structure. FIG. 3A shows the specific values of WH and WL in the $\lambda/(4\times n)$ structure and the $3\times\lambda/(4\times n)$ structure. Herein, $\lambda$ is 7.54 µm as described in (1). The refractive index n in the high-refractive-index portion is 3.098 (refractive index of Fe—InP at a wavelength of 7.54 µm) and the refractive index n in the low-refractive-index portion is 1 because the low-refractive-index portion is an air layer. Under these conditions, the effective reflectivity of the distributed Bragg reflection structure is calculated using a multilayer reflection model based on the plane wave approximation. FIG. 3B shows the calculation results. The characteristic lines (1), (2), (3), and (4) in the drawings in FIG. 3B show the calculation results of the following structures.

Model of characteristic line (1): The distance WL between the semiconductor walls (width of low-refractive-index portion) and the thickness WH of the semiconductor wall are each $\lambda/(4 \times n)$, and the distributed Bragg reflection structure includes two semiconductor walls.

Model of characteristic line (2): The distance WL and the thickness WH are each $\lambda/(4 \times n)$, and the distributed Bragg reflection structure includes one semiconductor wall.

Model of characteristic line (3): The distance WL and the thickness WH are each $3 \times \lambda/(4 \times n)$, and the distributed Bragg reflection structure includes two semiconductor walls.

Model of characteristic line (4): The distance WL and the thickness WH are each $3 \times \lambda/(4 \times n)$, and the distributed Bragg reflection structure includes one semiconductor wall.

In other words, the characteristic lines (1) and (2) show the calculation results of the $\lambda/(4 \times n)$ structure and the characteristic lines (3) and (4) show the calculation results of the $3 \times \lambda/(4 \times n)$ structure.

Referring to the calculation results shown in FIG. 3B, the distributed Bragg reflection structure including two semiconductor walls has a reflectivity of about 98% regardless of the $\lambda/(4 \times n)$ structure or the $3 \times \lambda/(4 \times n)$ structure. The distributed Bragg reflection structure including one semiconductor wall has a reflectivity of about 87%. In general, the cleaved end facet of a semiconductor layer has a reflectivity of about 30%. Thus, the reflectivity of a distributed Bragg reflection structure is increased to three times or more the reflectivity of a cleaved end facet.

As is understood from the results in FIGS. 3A and 3B, the $\lambda/(4 \times n)$ structure has a wide wavelength band that achieves high reflectivity compared with the $3 \times \lambda/(4 \times n)$ structure. However, since the thickness of the semiconductor wall of the $\lambda/(4 \times n)$ structure is 0.6085 µm, it is difficult to form a semiconductor wall having such a submicron width in the actual production process with high precision. On the other hand, the thickness of the semiconductor wall of the $3 \times \lambda/(4 \times n)$ structure is 1.886 µm, at which the semiconductor wall is easily formed using a typical etching apparatus without problems. Therefore, the semiconductor wall of the $3 \times \lambda/(4 \times n)$ structure is more easily produced than that of the $\lambda/(4 \times n)$ structure.

In the quantum cascade laser according to this embodiment, the distributed Bragg reflection structure exhibits high reflectivity and the threshold current of the quantum cascade laser is decreased. Furthermore, since the semiconductor walls of the distributed Bragg reflection structure are made of a single semiconductor material, desired verticality may be imparted to etched sidewalls. In addition, it is not necessary to determine different etching conditions for each semiconductor layer, and productivity is improved.

Second Embodiment

A method for producing a quantum cascade laser will be described with reference to FIG. 4A to FIG. 12D. In FIG. 4A to FIG. 12D, FIGS. 4A, 5A, 6A, 7A, 8A, 9A, 10A, 11A, and 12A are sectional views in a stacked semiconductor layer to be a laser main body, the sectional views being taken along a line (for example, in FIG. 4A, line IVa-IVa of FIG. 4C) perpendicular to a direction in which an optical waveguide extends. FIGS. 4B, 5B, 6B, 7B, 8B, 9B, 10B, 11B, and 12B are sectional views in a semiconductor wall of a distributed Bragg reflection structure, the sectional views being taken along a line (for example, in FIG. 4B, line IVb-IVb of FIG. 4C) perpendicular to a direction in which an optical waveguide extends. FIGS. 4C, 5C, 6C, 7C, 8C, 9C, 10C, 11C, and 12C are sectional views illustrating an optical waveguide, the sectional views being taken along a line (for example, in FIG. 4C, line IVc-IVc of FIG. 4A) that extends in a direction in which the optical waveguide extends. FIGS. 4D, 5D, 6D, 7D, 8D, 9D, 10D, 11D, and 12D are sectional views illustrating a current blocking semiconductor region, the sectional views being taken along a line (for example, in FIG. 4D, line IVd-IVd of FIG. 4A) that extends in a direction in which an optical waveguide extends.

Figure 4A:
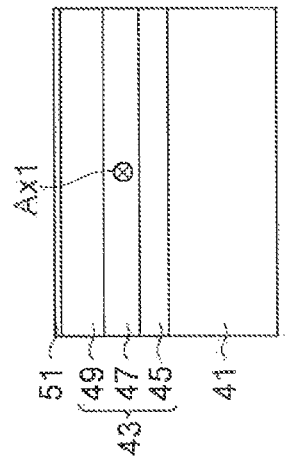
FIGS. 4A to 4D are sectional views illustrating a main process in a method for producing a quantum cascade laser according to a second embodiment.
Figure 4B:
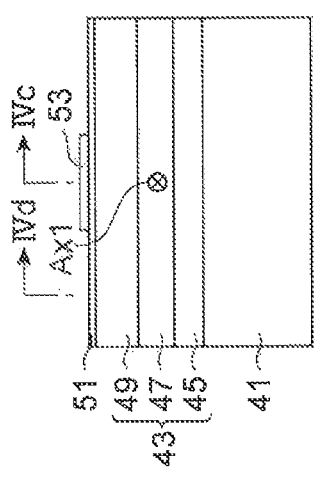
Figure 4C:
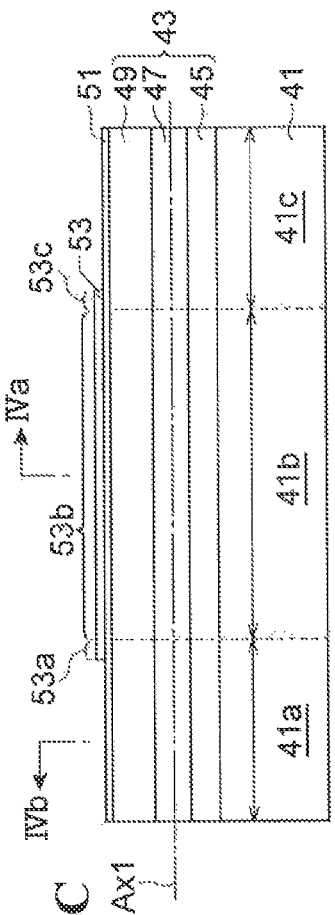
Figure 4D:
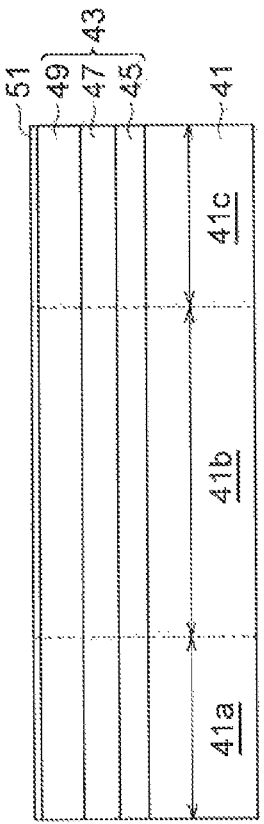
Figure 5A:
FIGS. 5A to 5D are sectional views illustrating a main process in the method for producing a quantum cascade laser according to the second embodiment.
Figure 5B:
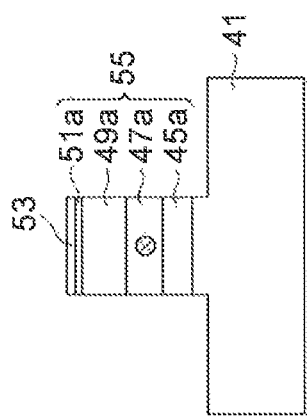
Figure 5C:
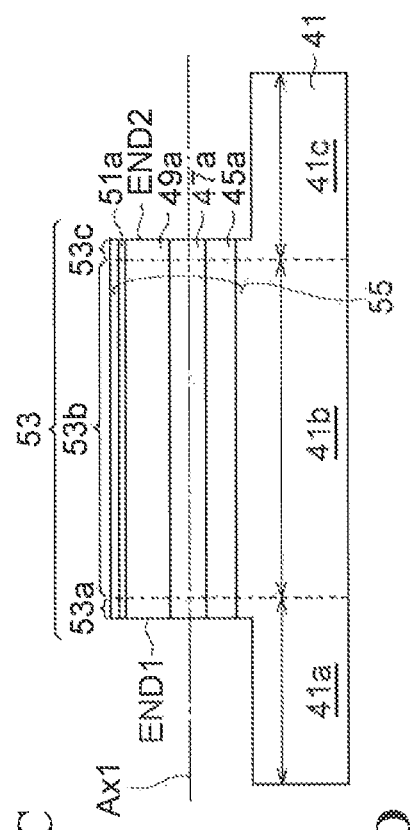
Figure 5D:
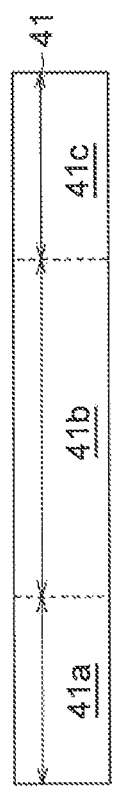

As illustrated in FIGS. 4A to 4D, an epitaxial semiconductor region 43 is grown on a substrate 41 by using a metal-organic vapor phase epitaxy (MOVPE) method or a molecular beam epitaxial growth (MBE) method, for example. In this embodiment, the epitaxial semiconductor region 43 includes an n-type lower cladding layer 45, a core layer 47, an n-type upper cladding layer 49, and a contact layer 51. After the crystal growth, a mask 53 having a pattern that defines a planar shape of a stripe-shaped stacked semiconductor layer of the quantum cascade laser is formed on the epitaxial semiconductor region 43 (in this embodiment, on the contact layer 51) as illustrated in FIGS. 4A and 4C. The mask 53 includes a pattern on a first region 41a, a second region 41b, and a third region 41c of a substrate 41. This pattern includes a second pattern 53b located on the second region 41b of the substrate 41, a first extending portion (first pattern 53a) that extends from the second pattern 53b in a direction extending from the second region 41b to the first region 41a of the substrate 41, and a second extending portion (third pattern 53c) that extends from the second pattern 53b in a direction extending from the second region 41b to the third region 41c of the substrate 41. The mask 53 has openings in a first region 41a and a third region 41c of the substrate 41. The mask 53 is formed by forming an insulating layer and then patterning the insulating layer by a photolithography method and an etching method. The insulating layer is a dielectric film made of SiN, SiON, alumina, or $SiO_2$, for example.

The substrate 41 and the epitaxial semiconductor region 43 are etched using the mask 53 to form a stripe-shaped stacked semiconductor layer 55 on part of the first region 41a, the second region 41b, and part of the third region 41c of the substrate 41 as illustrated in FIGS. 5A to 5D. The stacked semiconductor layer 55 is a region to be formed into a mesa waveguide. The stacked semiconductor layer 55 has end facets END1 and END2. The stacked semiconductor layer 55 includes an n-type lower cladding layer 45a, a core layer 47a, an n-type upper cladding layer 49a, and an n-type contact layer 51a. The n-type lower cladding layer 45a, the core layer 47a, the n-type upper cladding layer 49a, and the n-type contact layer 51a have a stripe shape. This etching may be performed by wet etching or dry etching. In order to control the width of the mesa waveguide constituted by the stacked semiconductor layer 55 with high precision, dry etching which is suitable for vertical etching is desirably employed. A reactive ion etching (RIE) method is used as an example of the dry etching method.

Figure 6A:
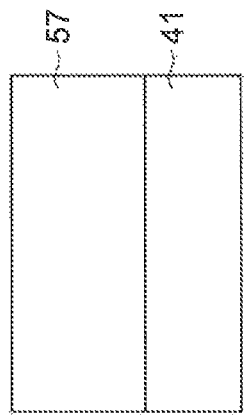
FIGS. 6A to 6D are sectional views illustrating a main process in the method for producing a quantum cascade laser according to the second embodiment.
Figure 6B:
Figure 6C:
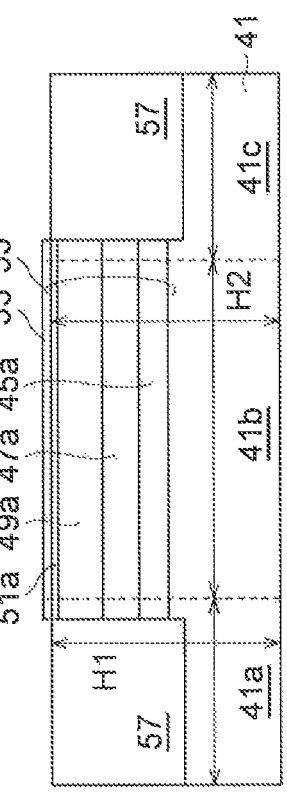
Figure 6D:
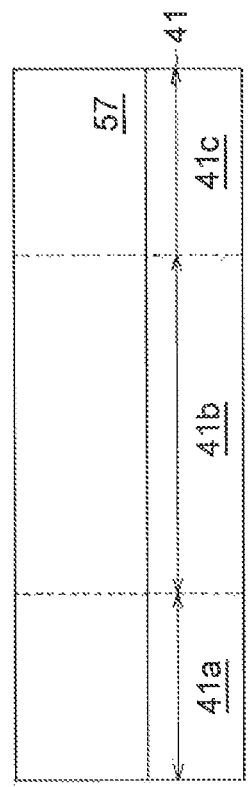
Figure 9A:
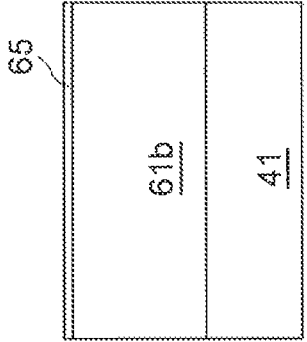
FIGS. 9A to 9D are sectional views illustrating a main process in the method for producing a quantum cascade laser according to the second embodiment.
Figure 9B:
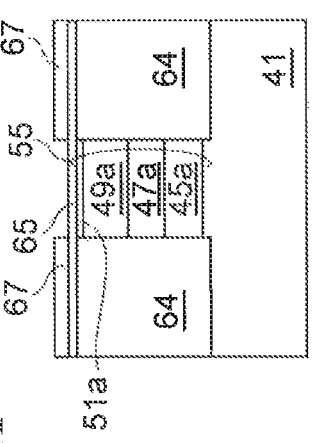
Figure 9C:
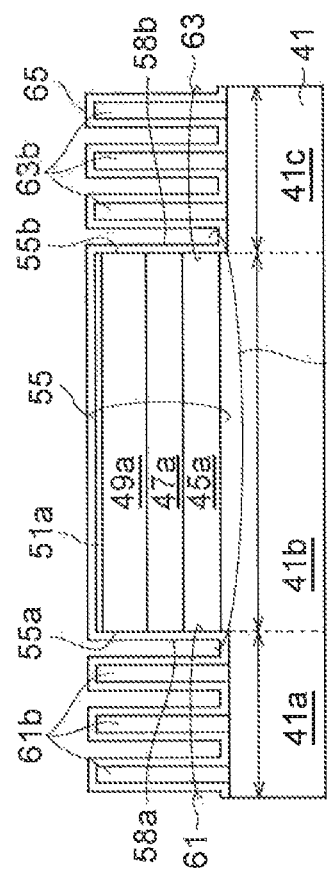
Figure 9D:
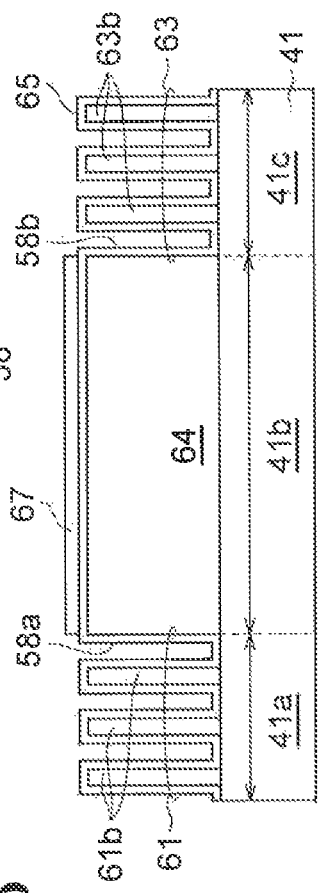
Figure 11A:
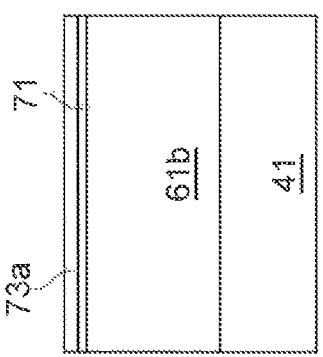
FIGS. 11A to 11D are sectional views illustrating a main process in the method for producing a quantum cascade laser according to the second embodiment.
Figure 11B:
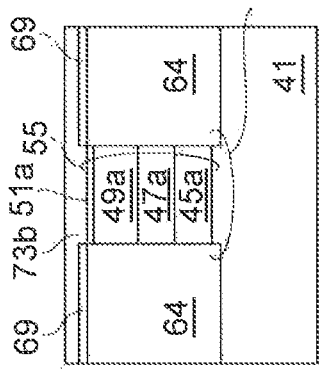
Figure 11C:
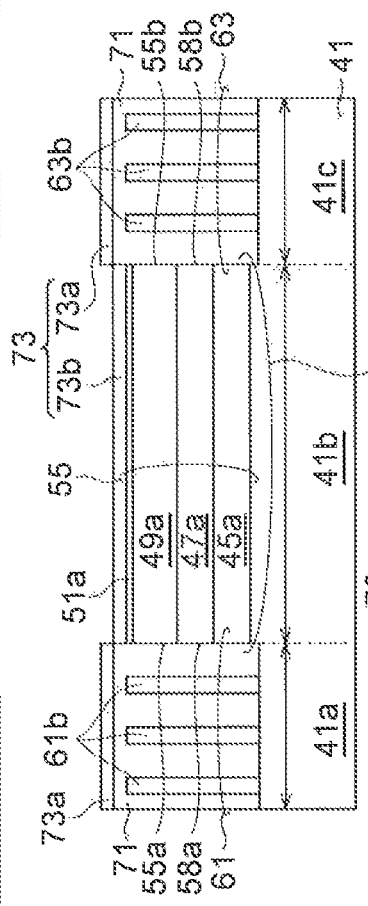
Figure 11D:
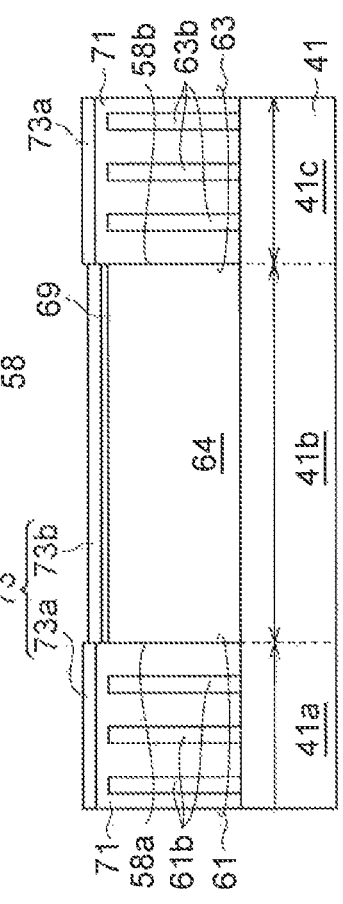
Figures 12A, 12B, 12C, 12D:
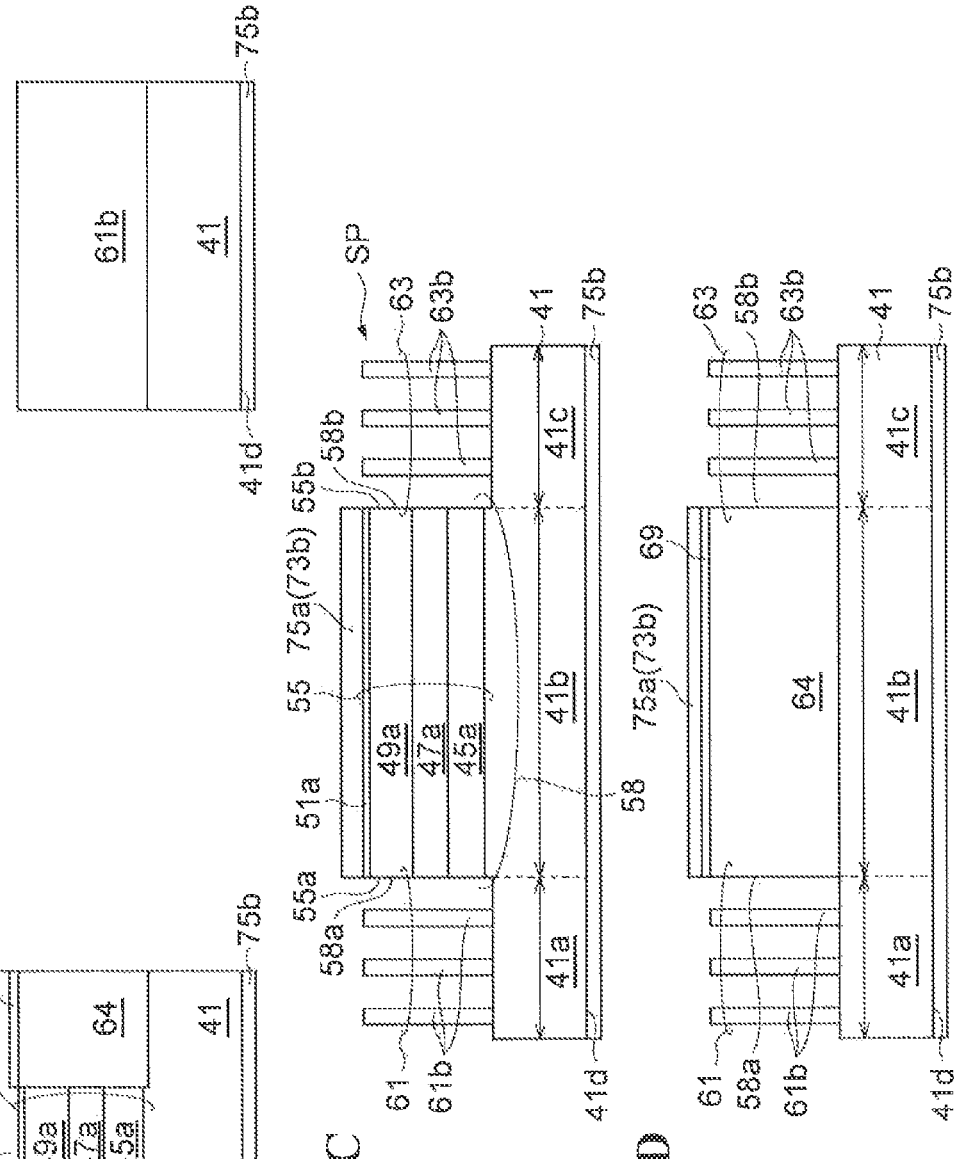
FIGS. 12A to 12D are sectional views illustrating a main process in the method for producing a quantum cascade laser according to the second embodiment.

Subsequently, as illustrated in FIGS. 6A to 6D, a buried layer is selectively grown on a side surface of the stripe-shaped stacked semiconductor layer 55 and on the exposed surface of the substrate 41 while remaining the mask 53 on the stripe-shaped stacked semiconductor layer 55. The mask 53 is used for a selective growth mask. In the growth of the buried layer, the buried layer is not grown on the pattern of the mask 53. In the embodiment, the buried layer 57 made of, for example, a semi-insulating semiconductor is grown on the substrate 41 and on the side surfaces and end facets 55a and 55b of the stacked semiconductor layer 55 so as to embed the stacked semiconductor layer 55. As a result, the buried layer 57 made of a semi-insulating semiconductor is grown so as to be in contact with the side surfaces and end facets 55a and 55b of the stacked semiconductor layer 55. Consequently, the stacked semiconductor layer 55 is embedded by the buried layer 57 made of a semi-insulating semiconductor. In this embodiment, the buried layer 57 is grown to the height of the upper surface of the stacked semiconductor layer 55. Therefore, as illustrated in FIG. 6D, the distance H between the upper surface of the buried layer 57 and the back surface of the substrate is substantially equal to the distance H2 between the upper surface of the stacked semiconductor layer 55 and the back surface of the substrate. The end facets END1 and END2 of the stacked semiconductor layer 55 are covered with the buried layer 57 made of, for example, a semi-insulating semiconductor.

After the regrowth process of the buried layer 57, the mask 53 is removed. Subsequently, as illustrated in FIGS. 7A to 7D, a mask 59 for forming a distributed Bragg reflection structure is formed on the upper surface of the buried layer 57 and the upper surface of the stacked semiconductor layer 55. The mask 59 includes a first pattern 59a and a third pattern 59c for forming semiconductor walls constituting a diffraction grating. The mask 59 also includes a second pattern 59b in the second region 41b of the substrate 41. The first pattern 59a and the third pattern 59c are respectively disposed in the first region 41a and the third region 41c of the substrate 41. As illustrated in FIG. 7A, the second pattern 59b includes a first covering portion 59d that covers an upper surface of the stacked semiconductor layer 55 in the second region 41b and a second covering portion 59f that covers an upper surface of the buried layer 57 in the second region 41b. The edge of the first covering portion 59d is recessed with respect to the position of a butt-joint structure at which the stacked semiconductor layer 55 is directly connected to the buried layer 57 along the first axis Ax1 by using a butt-joint method. The first pattern 59a and the third pattern 59c for forming the semiconductor walls are disposed away from the position of the butt-joint structure. The mask 59 has openings between the first pattern 59a and the second pattern 59b and between the third pattern 59c and the second pattern 59b along the first axis Ax1. The opening of the mask 59 is disposed on the butt-joint structure. Therefore, the semiconductor region including the butt-joint structure is removed using the mask 59 by etching. At the butt-joint structure, the buried layer 57 includes projections or steps on a surface thereof due to an abnormal growth. These projections or steps disposed at the butt-joint structure are also removed by etching. In this etching, the semiconductor walls (59a and 59c) and the end facets (55a and 55b) of the stacked semiconductor layer 55 are formed as described later in FIGS. 8A to 8D. The width of the opening of the mask 59 between the first pattern 59a and the second pattern 59b or between the third pattern 59c and the second pattern 59b along the first axis Ax1 is typically set to $\lambda/(4\times n)$ or $3\times\lambda/(4\times n)$ to form the low-refractive-index portion.

As illustrated in FIGS. 8A to 8D, the buried layer 57 and the stacked semiconductor layer 55 are etched using the mask 59. Thus, a distributed Bragg reflection structure 61 is formed in the first region 41a of the substrate 41. A current blocking layer 64 is formed in the second region 41b of the substrate 41. A distributed Bragg reflection structure 63 is formed in the third region 41c of the substrate 41. The stacked semiconductor layer 55 includes the end facets 55a and 55b. As a result of the etching, the distributed Bragg reflection structure 61 (63) includes semiconductor walls 61b (63b) that are arranged away from the end facet 55a (55b) of the stacked semiconductor layer 55. The stacked semiconductor layer 55 and the current blocking layer 64 constitute a laser structure 58 serving as a laser main body left as an integrated semiconductor. The laser structure 58 has end facets 58a and 58b (first end facet 25a and second end facet 25b) that intersect the first axis Ax1. The end facets 58a and 58b of the laser structure 58 include the end facets 55a and 55b of the stacked semiconductor layer 55, respectively. As described above, the etched surfaces of the semiconductor walls 61b (63b) need to have high verticality. Therefore, dry etching which is suitable for vertical etching is employed. Specifically, a reactive ion etching (RIE) method is used as the dry etching method.

After the dry etching, the mask 59 is removed. Then, a mask for forming an insulating layer is formed. As illustrated in FIGS. 9A to 9D, an insulating layer 65 is formed on the entire surface of the substrate. The insulating layer 65 is a dielectric film made of SiN, SiON, alumina, or $SiO_2$, for example. Subsequently, as illustrated in FIGS. 9A to 9D, the insulating layer 65 on the current blocking layer 64 is partially covered with a resist mask 67. The resist mask 67 has a first opening located on the upper surface of the stacked semiconductor layer 55 and a second opening located on the distributed Bragg reflection structure 61 (63).

As illustrated in FIGS. 10A to 10D, the insulating layer 65 is etched using the resist mask 67 to form an insulating layer 69 as a protection film. This etching may be performed by a dry etching method or a wet etching method. As a result, the insulating layer in the openings of the resist mask 67 is removed. Consequently, the insulating layer 69 is left on the current blocking layer 64 composed of the semi-insulating semiconductor layer.

After forming the insulating layer 69 on the current blocking layer 64, a resist mask 71 for forming an upper electrode is formed as illustrated in FIGS. 11A to 11D. The resist mask 71 is formed by photolithography. The resist mask 71 has an opening on the upper surface of the laser structure 58. After forming the resist mask 71, a metal layer 73 for forming an upper electrode is formed on the entire surface of the substrate as illustrated in FIGS. 11A to 11D. The formation of the metal layer 73 is performed by using an evaporation method or a sputtering method. The metal layer 73 includes a first portion 73a deposited on the pattern of the resist mask 71 and a second portion 73b deposited in the opening of the resist mask 71. After the formation of the metal layer 73, lift-off is performed. Thus, as illustrated in FIGS. 12A to 12D, the first portion 73a of the metal layer 73 on the resist mask 71 is selectively removed while the second portion 73b of the metal layer 73 is left as an upper electrode 75a on the upper surface of the laser structure 58. Then, the back surface of the substrate 41 is polished to an appropriate thickness for cleavage (in the embodiment, about 100 μm). Subsequently, a backside electrode 75b is formed on the polished surface 41d of the substrate 41. When necessary, the low-refractive-index portion of the distributed Bragg reflection structure 61 (63) may be an embedded region. The embedded region is filled with a material having a refractive index lower than that of a semiconductor of the high-refractive-index portion.

Through these steps, a substrate product SP for quantum cascade lasers is completed. A laser chip is produced from the substrate product SP.

In this production method, since the distributed Bragg reflection structure is made of a single semiconductor material, semiconductor walls having the side surfaces with good planarity and verticality are formed. Furthermore, since the current confinement structure and the distributed Bragg reflection structure are made of the same single semiconductor material, they are formed at a time by single regrowth and etching. The semiconductor material for the current confinement structure and the distributed Bragg reflection structure is not limited to a semi-insulating semiconductor, and may be, for example, an undoped semiconductor.

Third Embodiment

Figure 13:
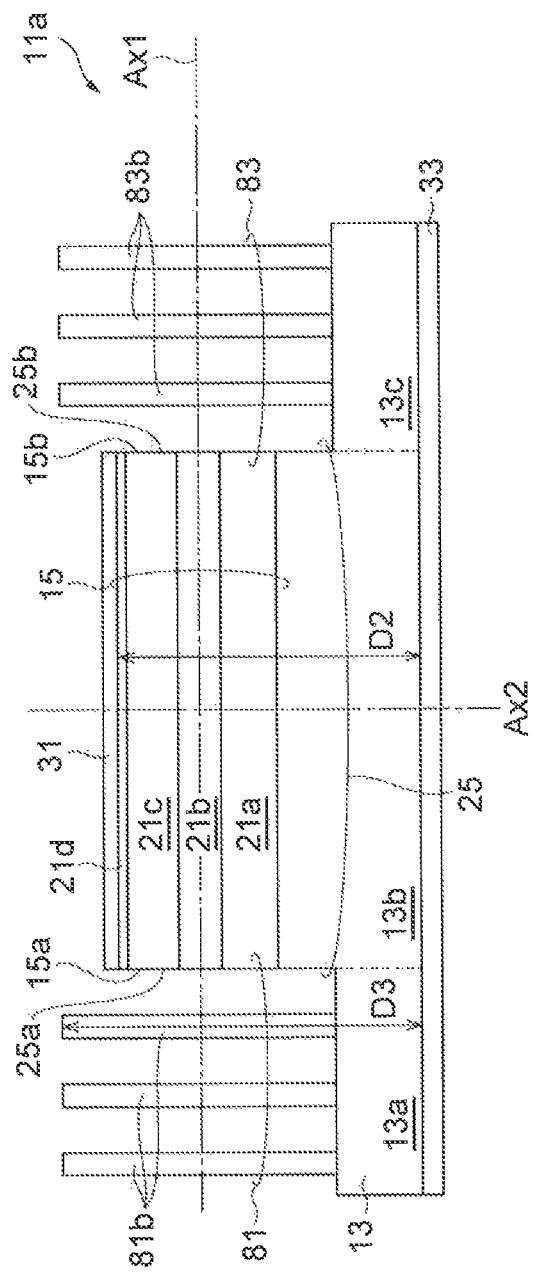
FIG. 13 schematically illustrate quantum cascade lasers according to a third embodiment.

FIG. 13 illustrates a quantum cascade laser 11a. The quantum cascade laser 11a includes a distributed Bragg reflection structure 81 (83) instead of the distributed Bragg reflection structure 17 (19) of the quantum cascade laser 11. The distributed Bragg reflection structure 81 (83) includes one or more semiconductor walls 81b (83b) that are arranged away from the end facet 15a (15b) of the stacked semiconductor layer 15. The end facet 15a (15b) of the stacked semiconductor layer 15 and the semiconductor walls 81b (83b) are arranged along the first axis Ax1 to constitute the distributed Bragg reflection structure 81 (83). The distance D3 between the upper ends of the semiconductor walls 81b (83b) and the back surface of the substrate 13 is larger than the distance D2 between the upper surface of the stacked semiconductor layer 15 and the back surface of the substrate 13. The semiconductor walls 81b (83b) are extended in the Ax2 direction with a predetermined distance so that light emitted from the core layer 21b in the stacked semiconductor layer 15 is almost completely reflected at the distributed Bragg reflection structure 81 (83) in consideration of the divergence angle of light. Accordingly, when the distributed Bragg reflection structure 81 (83) is used, high reflection is easily achieved at the end facet. This structure may be formed by the same production method as in the first embodiment, except that, in the region to be a distributed Bragg reflection structure in FIGS. 6A to 6D, the buried layer is regrown so that the uppermost surface of the buried layer 57 composed of the single semiconductor layer formed during the regrowth is located higher than the uppermost surface of the stacked semiconductor layer 55 in the laser main body region.

Fourth Embodiment

Figure 14:
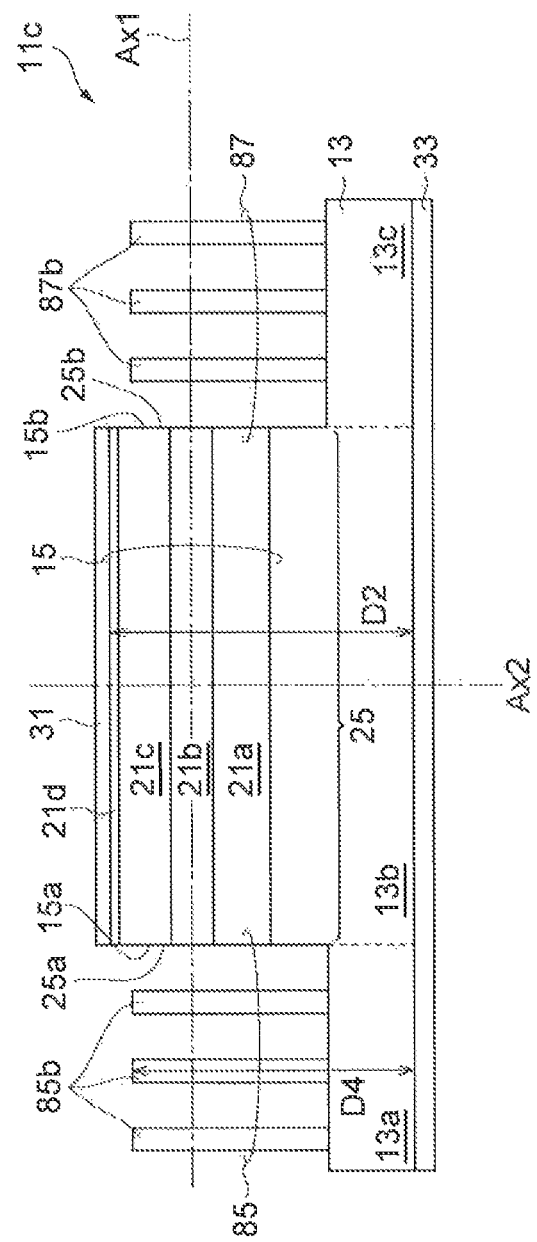
FIG. 14 schematically illustrates a quantum cascade laser according to a fourth embodiment.

FIG. 14 illustrates a quantum cascade laser 11c. The quantum cascade laser 11c includes a distributed Bragg reflection structure 85 (87) instead of the distributed Bragg reflection structure 17 (19) of the quantum cascade laser 11. The distributed Bragg reflection structure 85 (87) includes one or more semiconductor walls 85b (87b) that are arranged away from the end facet 15a (15b) of the stacked semiconductor layer 15. The end facet 15a (15b) of the stacked semiconductor layer 15 and the semiconductor walls 85b (87b) are arranged along the first axis Ax1 to constitute the distributed Bragg reflection structure 85 (87). The distance D4 between the upper end of the semiconductor walls 85b (87b) and the back surface of the substrate 13 is smaller than the distance D2 between the upper surface of the stacked semiconductor layer 15 and the back surface of the substrate 13. This structure may be formed by the same production method as in the first embodiment, except that, in FIGS. 6A to 6D, after the buried layer 57 composed of the single semiconductor layer is grown, only an upper portion of the buried layer 57 in a region where a distributed Bragg reflection structure is to be formed is etched. The reflectivity in the distributed Bragg reflection structure 85 (87) is smaller than that of the distributed Bragg reflection structure 17 (19) of the quantum cascade laser 11. However, by adjusting the distance D4, the high effective reflectivity in the distributed Bragg reflection structure 85 (87) is obtained. In addition, in this embodiment, the etching depth required to form the semiconductor walls 85b (87b) is small. Therefore, the semiconductor walls 85b (87b) is processed in a small etching amount. This structure contributes to an improvement in the processing accuracy for the semiconductor walls 85b (87b).

Fifth Embodiment

Referring to FIG. 15A, the quantum cascade laser 11c is mounted in an epi-down configuration on a sub-mount 89 including a heatsink through a solder material 88, for example. In mounting the quantum cascade laser chip in the epi-down configuration, the upper electrode 31 on the stacked semiconductor layer 15 is supported by the sub-mount 89 through the solder material 88. Therefore, the semiconductor walls 85b (87b) having a relatively small thickness are not directly supported by the sub-mount 89. Thus, the quantum cascade laser chip is mounted on the sub-mount 89 without bringing the semiconductor walls 85b (87b) into contact with the solder material 88 or the sub-mount 89. Accordingly, the physical damage to the semiconductor walls 85b (87b) during mounting the quantum cascade laser chip is avoided. The solder material may be, for example, In or AuSn. The sub-mount may be made of, for example, Cu, diamond, or AlN. A difference between the distance D2 and the distance D4 is set to be from 0.1 µm to 5 µm, for example.

Referring to FIG. 15B, the quantum cascade laser 11a is mounted in an epi-up configuration on a sub-mount 89 including a heatsink through a solder material 88. In this epi-up mounting configuration, the backside electrode 33 of the quantum cascade laser 11a is in contact with the solder material 88 on the sub-mount 89. This epi-up mounting configuration may be applied not only to the quantum cascade laser 11a but also to the quantum cascade laser 11c.

Sixth Embodiment

FIG. 16A is a plan view of the quantum cascade laser 11 illustrated in FIG. 1 and FIG. 2. In FIG. 16A, the upper surface of the laser structure 25 is covered with the upper electrode 31. Therefore, the semiconductor mesa waveguide MESA is indicated by a broken line. In the quantum cascade laser 11, the semiconductor walls 17a (19a) extend along a third axis Ax3 that intersects the first axis Ax1 and the second axis Ax2, from an upper edge of one surface 13g of the substrate 13 to an upper edge of the other side surface 13h. Furthermore, the semiconductor walls 17a (19a) are periodically arranged along the first axis Ax1 so as to form a distributed Bragg reflection structure.

As illustrated in FIG. 16B, in a quantum cascade laser 11d, the distributed Bragg reflection structure 17 (19) may further include a first connecting portion 17c (19c). The first connecting portion 17c (19c) extends along the first axis Ax1 and connects ends of a plurality of semiconductor walls 17a (19a) to each other. The first connecting portion 17c (19c) extends along the upper edge of one side surface 13g of the substrate 13. In this quantum cascade laser 11d, the first connecting portion 17c (19c) connects the semiconductor walls 17a (19a) so as to integrate the first connecting portion 17c (19c) and the semiconductor walls 17a (19a). The first connecting portion 17c (19c) increases the mechanical strength of the distributed Bragg reflection structure 17 (19). As a result, the production yield of the quantum cascade laser 11d is improved. The durability of the quantum cascade laser 11d is also improved.

The distributed Bragg reflection structure 17 (19) may further include a third connecting portion 17d (19d). The third connecting portion 17d (19d) extends along the first axis Ax1 and connects the other ends of the semiconductor walls 17a (19a) to each other. The first connecting portion 17c (19c) and the third connecting portion 17d (19d) each have a shape of a connecting wall, which allows structural reinforcement. The third connecting portion 17d (19d) also increases the mechanical strength of the distributed Bragg reflection structure 17 (19) which makes it difficult to damage the distributed Bragg reflection structure 17 (19). In the quantum cascade laser 11d illustrated in FIG. 16B, the first connecting portion 17c (19c) and the third connecting portion 17d (19d) connect all the semiconductor walls 17a (19a), but may connect some of the plurality of semiconductor walls 17a (19a).

The first connecting portion 17c (19c) and the third connecting portion 17d (19d) are preferably made of the same material as that of the semiconductor walls 17a (19a). According to the quantum cascade laser 11d, the semiconductor walls 17a (19a), the first connecting portion 17c (19c), and the third connecting portion 17d (19d) are made of the same semiconductor material. Thus, the strength of the distributed Bragg reflection structure 17 (19) is improved. Furthermore, since the semiconductor walls 17a (19a), the first connecting portion 17c (19c), and the third connecting portion 17d (19d) are made of the same material, the growth process and working process may be performed at a time.

Seventh Embodiment

Figure 17:
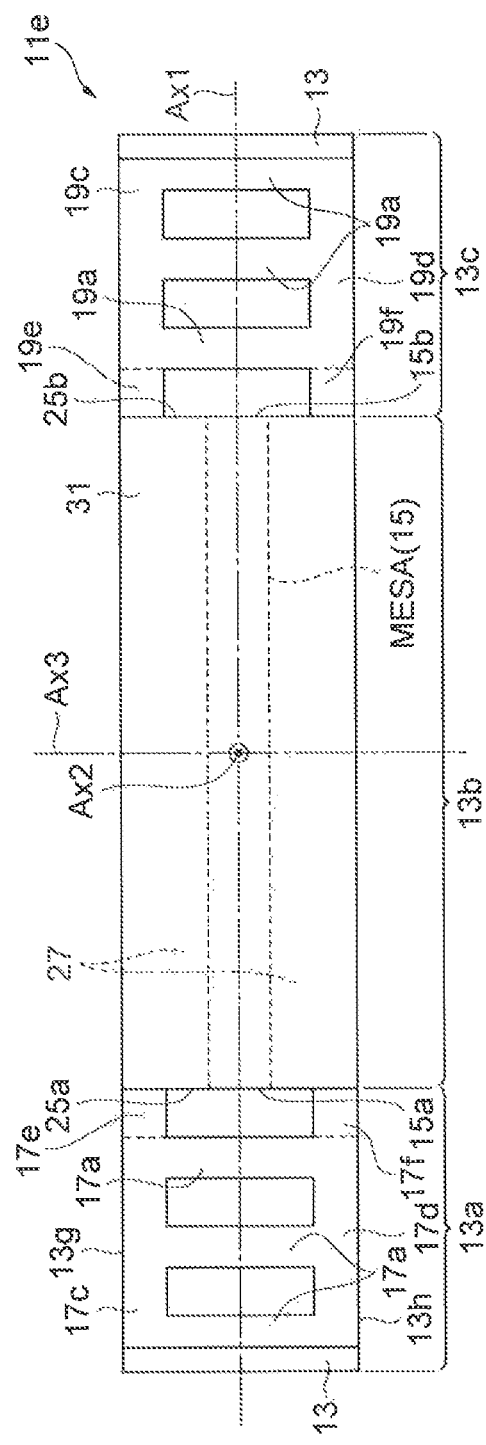
FIG. 17 schematically illustrates a quantum cascade laser according to a seventh embodiment.

In a quantum cascade laser 11e illustrated in FIG. 17, the distributed Bragg reflection structure 17 (19) may further include a second connecting portion 17e (19e). The second connecting portion 17e (19e) connects one of the semiconductor walls 17a (19a) and the current blocking layer 27 of the laser structure 25. The second connecting portion 17e (19e) extends along the first axis Ax1. In this quantum cascade laser 11e, the second connecting portion 17e (19e) connects the current blocking layer 27 to the semiconductor wall 17a (19a) so as to integrate the second connecting portion 17e (19e), the semiconductor wall 17a (19a), and the laser structure 25. Therefore, the second connecting portion 17e (19e) increases the mechanical strength of the distributed Bragg reflection structure 17 (19). In FIG. 17, the quantum cascade laser 11e includes the first connecting portion 17c (19c) in addition to the second connecting portion 17e (19e). However, the first connecting portion 17c (19c) is not necessarily included.

The distributed Bragg reflection structure 17 (19) may further include a fourth connecting portion 17f (19f). The fourth connecting portion 17f (19f) connects the current blocking layer 27 of the laser structure 25 and one of the semiconductor walls 17a (19a). The fourth connecting portion 17f (19f) extends along the first axis Ax1. The fourth connecting portion 17f (19f) increases the mechanical strength of the distributed Bragg reflection structure 17 (19). In FIG. 17, the quantum cascade laser 11e includes the third connecting portion 17d (19d) in addition to the fourth connecting portion 17f (19f). However, the third connecting portion 17d (19d) is not necessarily included.

The second connecting portion 17e (19e) and the fourth connecting portion 17f (19f) are preferably made of the same material as the semiconductor walls 17a (19a). According to the quantum cascade laser 11e, the semiconductor wall 17a (19a), the second connecting portion 17e (19e), and the fourth connecting portion 17f (19f) are connected to each other. Therefore, the strength of the distributed Bragg reflection structure 17 (19) is improved. Furthermore, since the semiconductor wall 17a (19a), the second connecting portion 17e (19e), and the fourth connecting portion 17f (19f) are made of the same material, the semiconductor growth and processing for them can be performed at a time and the production process for the distributed Bragg reflection structure can be simplified.

The second connecting portion 17e (19e) and the fourth connecting portion 17f (19f) are preferably made of the same material as the semiconductor walls 17a (19a) and the current blocking layer 27. According to the quantum cascade laser 11e, the current blocking layer 27, the semiconductor wall 17a (19a), the second connecting portion 17e (19e), and the fourth connecting portion 17f (19f) are connected to each other, and thus are constituted as a uniform structure in terms of material. Therefore, the strength of the distributed Bragg reflection structure 17 (19) is improved. Furthermore, since the current blocking layer 27, the semiconductor wall 17a (19a), the second connecting portion 17e (19e), and the fourth connecting portion 17f (19f) are made of the same material, the growth process and working process may be performed at a time.

Eighth Embodiment

Figure 18:
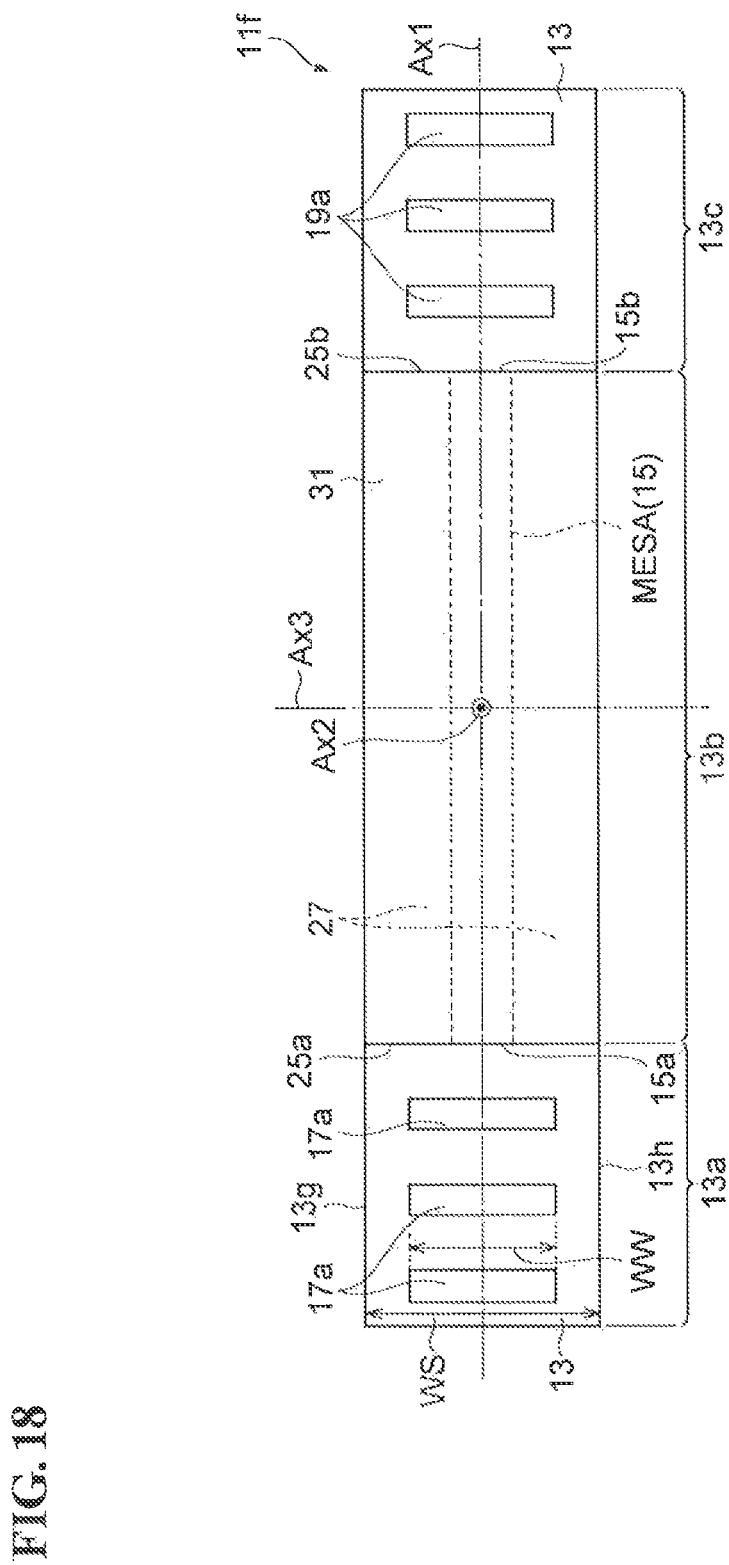
FIG. 18 schematically illustrates a quantum cascade laser according to an eighth embodiment.

In a quantum cascade laser 11f illustrated in FIG. 18, the semiconductor walls 17a (19a) have a wall width WW along the third axis Ax3. The substrate 13 has a substrate width WS along the third axis Ax3. In this embodiment, the left and right ends of each of the semiconductor walls 17a (19a) are located away from the upper edge of one side surface 13g of the substrate 13 and the upper edge of the other side surface 13h. In the quantum cascade laser 11f, the wall width WW is smaller than the substrate width WS. According to this quantum cascade laser 11f, an ununiformity in etching rate in a wafer due to a micro-loading effect described later is reduced during forming the semiconductor walls 17a (19a) by dry etching. Therefore, the in-plane uniformity and reproducibility of etching may be improved.

Ninth Embodiment

Figure 19A:
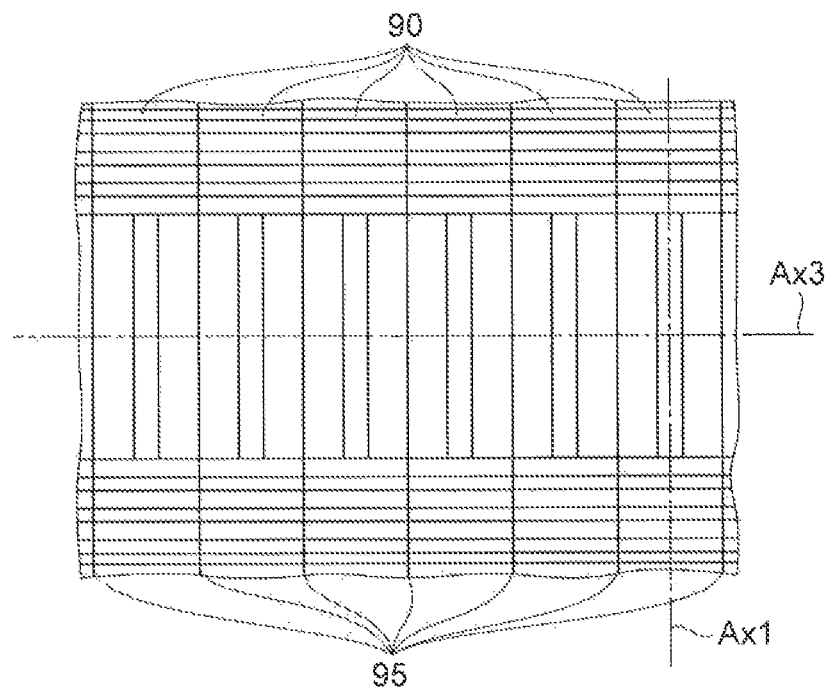
FIGS. 19A and 19B schematically illustrate quantum cascade lasers according to a ninth embodiment.
Figure 19B:
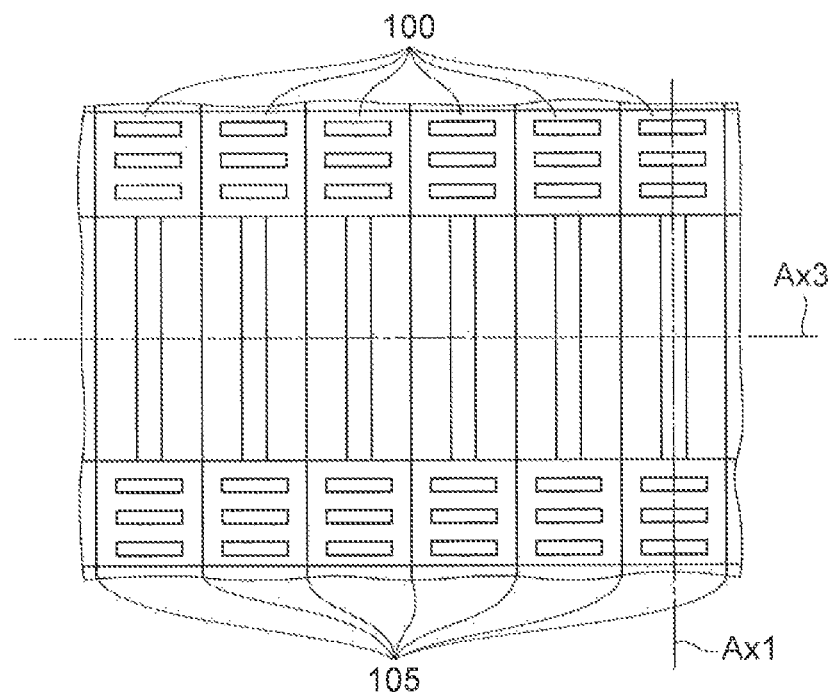

In the production of the quantum cascade laser illustrated in FIG. 4A to FIG. 12D, many quantum cascade lasers arranged in many element sections are simultaneously formed on a wafer to complete the above-described substrate product SP. Subsequently, the substrate product SP is divided into individual semiconductor laser chips. FIG. 19A illustrates the substrate product SP of the quantum cascade laser 11. Referring to FIG. 19A, six element sections 90 for forming the quantum cascade lasers 11 are illustrated. FIG. 19B illustrates the substrate product SP of the quantum cascade laser 11f. Referring to FIG. 19B, six element sections 100 for forming the quantum cascade lasers 11f are illustrated.

In FIG. 19A, semiconductor walls to constitute the distributed Bragg reflection structure 17 (19) are connected to each other across the boundaries 95 of the element sections. On the other hand, in FIG. 19B, semiconductor walls to constitute the distributed Bragg reflection structure 17 (19) are away from the boundaries 105 of the element sections. Here, the boundaries 105 extend along the first axis Ax1. Therefore, the semiconductor walls are not present at the boundaries 105 of the element sections. Therefore, when the semiconductor walls 17a (19a) are formed by using a dry etching method, the stagnation of gas caused by the semiconductor walls is reduced in the substrate product SP of the quantum cascade lasers 11f illustrated in FIG. 19B compared with the substrate product SP of the quantum cascade lasers 11 illustrated in FIG. 19A. Thus, the etching gas easily flows along the first axis Ax1 and the third axis Ax3 in the substrate product SP illustrated in FIG. 19B. Consequently, the etching gas is circulated well, and the variation in etching rate due to a micro-loading effect in the in-plane directions of the substrate is reduced in the substrate product SP illustrated in FIG. 19B. Accordingly, the in-plane uniformity and reproducibility of etching during the formation of the semiconductor walls 17a (19a) is further improved in the quantum cascade laser 11f than in the quantum cascade laser 11.

As shown in FIG. 19B, the semiconductor walls are not present at the boundaries 105 of the element sections. Therefore, a pressing force is not applied to the semiconductor walls during dividing the substrate product SP into the semiconductor laser chips by pressing the wafer. Therefore, the production yield is not decreased even if a pressing force is applied on the wafer in dividing the substrate product SP into the semiconductor laser chips.

Furthermore, the ratio (WW/H) of the wall width WW of the semiconductor walls 17a (19a) to the height H of the semiconductor walls 17a (19a) along the second axis Ax2 is smaller in the quantum cascade laser 11f than in the quantum cascade laser 11. Therefore, the mechanical strength of the semiconductor walls 17a (19a) may be further improved in the quantum cascade laser 11f than in the quantum cascade laser 11.

Principles of the present invention have been described in the preferred embodiments with reference to the drawings. However, those skilled in the art understand that the present invention can be changed in arrangement and in details without departing from the principles. The present invention is not limited to the specific configurations disclosed in the embodiments. Therefore, the Claims and all the modifications and changes within the spirit of the Claims are claimed as the invention.

What is claimed is:

1. A quantum cascade laser comprising:
a substrate having a principal surface including a first region and a second region arranged along a first axis;
a laser structure disposed on the principal surface in the second region of the substrate, the laser structure having an end facet intersecting the first axis, the laser structure including a stripe-shaped stacked semiconductor layer extending along the first axis; and
a distributed Bragg reflection structure disposed on the principal surface in the first region of the substrate, the distributed Bragg reflection structure including a semiconductor wall made of a single semiconductor material, the distributed Bragg reflection structure being optically coupled to the end facet of the laser structure, wherein
the semiconductor wall has a first side surface and a second side surface opposite to the first side surface,
the first side surface and the second side surface intersect the first axis and extend along a second axis intersecting the principal surface,
the semiconductor wall is located away from the end facet of the laser structure,
the end facet of the laser structure and the first and second side surfaces of the semiconductor wall are arranged along the first axis,
the distributed Bragg reflection structure has a low-refractive-index portion disposed between the end facet of the laser structure and the first side surface and a high-refractive-index portion disposed between the first side surface and the second side surface,
the low-refractive-index portion has a thickness along the first axis that is an odd multiple of $\lambda/(4 \times n1)$, and
the high-refractive-index portion has a thickness along the first axis that is an odd multiple of $\lambda/(4 \times n2)$,
where "$\lambda$" represents a lasing wavelength in vacuum, "n1" represents an effective refractive index of the low-refractive-index portion at the lasing wavelength, and "n2" represents an effective refractive index of the high-refractive-index portion at the lasing wavelength.

2. The quantum cascade laser according to claim 1, wherein
the stripe-shaped stacked semiconductor layer includes a core layer and a cladding layer disposed on the core layer, and
the core layer and the cladding layer are exposed at the end facet of the laser structure.

3. The quantum cascade laser according to claim 1, wherein
the distributed Bragg reflection structure includes one or more additional semiconductor walls,
the distributed Bragg reflection structure further includes a connecting portion that connects the semiconductor wall and the additional semiconductor walls or that connects the additional semiconductor walls with each other, and extends along the first axis.

4. The quantum cascade laser according to claim 3, wherein the connecting portion and the additional semiconductor walls are made of the same semiconductor material as the semiconductor wall.

5. The quantum cascade laser according to claim 1, further comprising a connecting portion that connects the semiconductor wall and the laser structure, and that extends along the first axis.

6. The quantum cascade laser according to claim 5, wherein the connecting portion connecting the semiconductor wall and the laser structure is made of the same semiconductor material as the semiconductor wall.

7. The quantum cascade laser according to claim 5, wherein
the stripe-shaped stacked semiconductor layer includes a mesa waveguide,
the laser structure includes a current blocking layer disposed on a side surface of the mesa waveguide and on the principal surface of the substrate,
the current blocking layer is connected to the connecting portion connecting the semiconductor wall and the laser structure, and the current blocking layer and the semiconductor wall are made of the same semiconductor material as the connecting portion connecting the semiconductor wall and the laser structure.

8. The quantum cascade laser according to claim 1, wherein the semiconductor material constituting the semiconductor wall is an undoped semiconductor or a semi-insulating semiconductor.

9. The quantum cascade laser according to claim 1, wherein the semiconductor wall has a top surface that is located higher than a top surface of the laser structure.

10. The quantum cascade laser according to claim 1, wherein the semiconductor wall has a top surface that is located lower than a top surface of the laser structure.

11. The quantum cascade laser according to claim 1, wherein
the semiconductor wall has a wall width along a third axis that intersects the first axis and the second axis,
the substrate has a substrate width along the third axis, and
the wall width is smaller than the substrate width.

12. The quantum cascade laser according to claim 1, wherein the distributed Bragg reflection structure further includes one or more additional semiconductor walls and an embedded region that is disposed between the semiconductor wall and the end facet of the laser structure, between the semiconductor wall and the one additional semiconductor wall, or between the additional semiconductor walls, and
the embedded region contains at least one of silicon dioxide, silicon oxy-nitride, silicon nitride, alumina, BCB resin, and polyimide resin.

13. The quantum cascade laser according to claim 1, wherein the distributed Bragg reflection structure further includes one or more additional semiconductor walls and a gap that is between the semiconductor wall and the end facet of the laser structure, between the semiconductor wall and the one additional semiconductor wall, or between the additional semiconductor walls.

14. A quantum cascade laser comprising:
a substrate having a principal surface including a first region and a second region arranged along a first axis;
a laser structure disposed on the principal surface in the second region of the substrate, the laser structure having an end facet intersecting the first axis, the laser structure including a stripe-shaped stacked semiconductor layer and a current blocking layer, the stripe-shaped semiconductor layer extending along the first axis and including a mesa waveguide, the current blocking layer being disposed on a side surface of the mesa waveguide and on the principal surface of the substrate;
a distributed Bragg reflection structure disposed on the principal surface in the first region of the substrate, the distributed Bragg reflection structure including a semiconductor wall made of a single semiconductor material, the distributed Bragg reflection structure being optically coupled to the end facet of the laser structure; and
a connecting portion that connects the semiconductor wall and the laser structure, the connecting portion extending along the first axis, wherein
the semiconductor wall has a first side surface and a second side surface opposite to the first side surface,
the first side surface and the second side surface intersect the first axis and extend along a second axis intersecting the principal surface,
the semiconductor wall is located away from the end facet of the laser structure,
the current blocking layer is connected to the connecting portion, and
the current blocking layer and the semiconductor wall are made of the same semiconductor material as the connecting portion.

15. The quantum cascade laser according to claim 14, wherein the connecting portion is made of the same semiconductor material as the semiconductor wall.

16. A quantum cascade laser comprising:
a substrate having a principal surface including a first region and a second region arranged along a first axis;
a laser structure disposed on the principal surface in the second region of the substrate, the laser structure having an end facet intersecting the first axis, the laser structure including a stripe-shaped stacked semiconductor layer extending along the first axis; and
a distributed Bragg reflection structure disposed on the principal surface in the first region of the substrate, the distributed Bragg reflection structure including a semiconductor wall made of a single semiconductor material, the distributed Bragg reflection structure being optically coupled to the end facet of the laser structure, wherein
the semiconductor wall has a first side surface and a second side surface opposite to the first side surface,
the first side surface and the second side surface intersect the first axis and extend along a second axis intersecting the principal surface,
the semiconductor wall is located away from the end facet of the laser structure, and
the semiconductor wall has a top surface that is located higher than a top surface of the laser structure.

17. A quantum cascade laser comprising:
a substrate having a principal surface including a first region and a second region arranged along a first axis;
a laser structure disposed on the principal surface in the second region of the substrate, the laser structure having an end facet intersecting the first axis, the laser structure including a stripe-shaped stacked semiconductor layer extending along the first axis; and
a distributed Bragg reflection structure disposed on the principal surface in the first region of the substrate and optically coupled to the end facet of the laser structure, the distributed Bragg reflection structure including a semiconductor wall made of a single semiconductor material, one or more additional semiconductor walls, and an embedded region that is disposed between the semiconductor wall and the end facet of the laser structure, between the semiconductor wall and the one additional semiconductor wall, or between the additional semiconductor walls, wherein
the semiconductor wall has a first side surface and a second side surface opposite to the first side surface,
the first side surface and the second side surface intersect the first axis and extend along a second axis intersecting the principal surface,
the semiconductor wall is located away from the end facet of the laser structure, and
the embedded region contains at least one of silicon dioxide, silicon oxy-nitride, silicon nitride, alumina, BCB resin, and polymide resin.

* * * * *